(12) United States Patent
Kim et al.

(10) Patent No.: US 11,463,115 B2
(45) Date of Patent: Oct. 4, 2022

(54) ELECTRONIC DEVICE AND COMMUNICATION DEVICE CALIBRATION METHOD OF ELECTRONIC DEVICE

(71) Applicant: Samsung Electronics Co., Ltd., Suwon-si (KR)

(72) Inventors: Jiyong Kim, Suwon-si (KR); Hyoseok Na, Suwon-si (KR); Yeonjeong Kim, Suwon-si (KR); Youngju Kim, Suwon-si (KR); Jungjoon Kim, Suwon-si (KR); Jihoon Kim, Suwon-si (KR); Jongin Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 197 days.

(21) Appl. No.: 16/766,105

(22) PCT Filed: Nov. 23, 2018

(86) PCT No.: PCT/KR2018/014491
§ 371 (c)(1),
(2) Date: May 21, 2020

(87) PCT Pub. No.: WO2019/103511
PCT Pub. Date: May 31, 2019

(65) Prior Publication Data
US 2021/0376869 A1 Dec. 2, 2021

(30) Foreign Application Priority Data

Nov. 27, 2017 (KR) .................. 10-2017-0159630

(51) Int. Cl.
*H04B 1/04* (2006.01)
*H03F 3/24* (2006.01)
(Continued)

(52) U.S. Cl.
CPC ............... *H04B 1/04* (2013.01); *H03F 3/245* (2013.01); *H03G 3/3042* (2013.01); *H03F 2200/451* (2013.01); *H03G 2201/103* (2013.01)

(58) Field of Classification Search
None
See application file for complete search history.

(56) References Cited

U.S. PATENT DOCUMENTS 5,644,316 A 7/1997 Lewis et al.
6,178,313 B1 1/2001 Mages et al.
(Continued)

FOREIGN PATENT DOCUMENTS

WO 2013/052234 A1 4/2013

OTHER PUBLICATIONS

European Examination Report dated Nov. 19, 2021, issued in European Application No. 18881113.7.
European Search Report dated Nov. 26, 2020, issued in European Application No. 18881113.7.

*Primary Examiner* — Pablo N Tran
(74) *Attorney, Agent, or Firm* — Jefferson IP Law, LLP

(57) ABSTRACT

An electronic device according to various embodiments of the present invention comprises: a housing; a plurality of antennas arranged on or inside the housing; a second communication circuit located inside the housing and electrically connected to the plurality of antennas; a first communication circuit, which is electrically connected to the second communication circuit, and generates a radio frequency (RF) signal or an intermediate frequency (IF) signal so as to transmit the RF or IF signal to the second communication circuit; a memory for storing at least one parameter set to correspond to the characteristic of the second communication circuit; and a control circuit electrically connected to the first communication circuit, wherein the control circuit can (Continued)

be set to transmit a control signal for controlling at least one amplifier included in the second communication circuit to the second communication circuit on the basis of the at least one parameter stored in the memory. Various embodiments of the present invention can be other embodiments.

14 Claims, 21 Drawing Sheets

(51) Int. Cl.
*H01Q 3/26* (2006.01)
*G01S 7/40* (2006.01)
*G01S 7/28* (2006.01)
*H03G 3/30* (2006.01)

(56) References Cited

U.S. PATENT DOCUMENTS

| | | | |
|---|---|---|---|
| 6,812,905 B2 * | 11/2004 | Thomas | H01Q 1/246 |
| | | | 342/359 |
| 7,382,182 B2 | 6/2008 | Trocke et al. | |
| 8,049,662 B2 * | 11/2011 | Stayton | G01S 13/781 |
| | | | 342/174 |
| 10,951,245 B2 * | 3/2021 | Lee | H04B 1/40 |
| 11,095,349 B2 * | 8/2021 | Cho | H01Q 5/35 |
| 2007/0001756 A1 | 1/2007 | Trocke et al. | |
| 2010/0013527 A1 | 1/2010 | Warnick | |
| 2010/0136922 A1 | 6/2010 | Rofougaran | |
| 2014/0145879 A1 | 5/2014 | Pan | |
| 2017/0279479 A1 | 9/2017 | Adams et al. | |

* cited by examiner

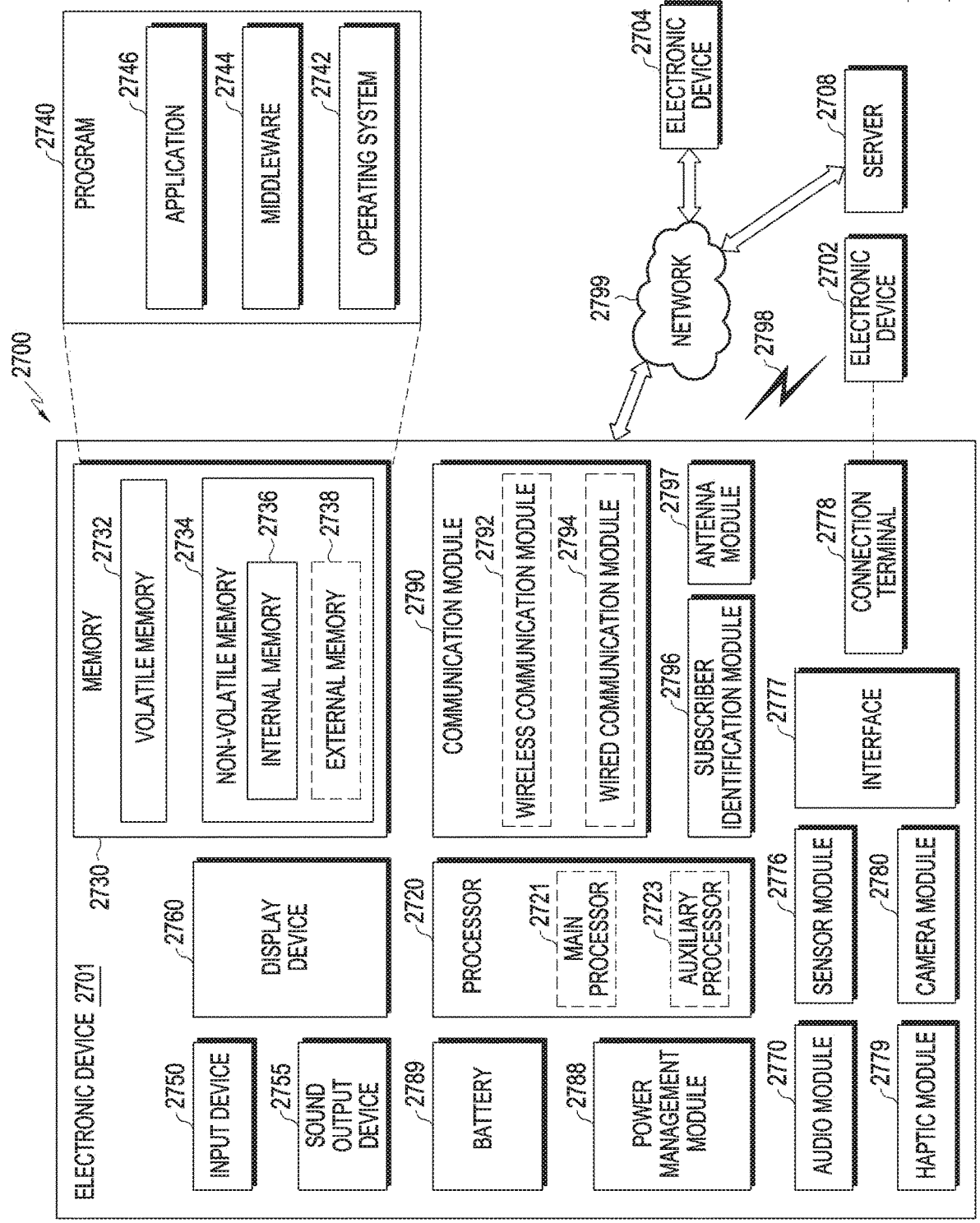

ELECTRONIC DEVICE AND COMMUNICATION DEVICE CALIBRATION METHOD OF ELECTRONIC DEVICE

CROSS-REFERENCE TO RELATED APPLICATION(S)

This application is a U.S. National Stage application under 35 U.S.C. § 371 of an International application number PCT/KR2018/014491, filed on Nov. 23, 2018, which is based on and claimed priority of a Korean patent application number 10-2017-0159630, filed on Nov. 27, 2017, in the Korean Intellectual Property Office, the disclosure of which is incorporated by reference herein in its entirety.

TECHNICAL FIELD

Various embodiments of the present disclosure relate to an electronic device and a method for calibrating a communication device in the electronic device.

BACKGROUND ART

In order to meet the demand for wireless data traffic soaring since $4^{th}$-Generation (4G) communication systems came to the market, there are ongoing efforts to develop enhanced $5^{th}$-Generation (5G) communication systems or pre-5G communication systems. For this reason, the 5G communication system or the pre-5G communication system is also called a beyond-4G-network communication system or a post-long term evolution (LTE) system.

To achieve higher data transmit rates, 5G communication systems are considered to be implemented on ultra high frequency bands (mmWave), such as, e.g., 60 GHz. In the 5G communication system, beamforming, massive multi-input multi-output (MIMO), full dimensional MIMO (FD-MIMO), an array antenna, analog beamforming, and large-scale antenna technologies have been discussed to alleviate propagation path loss and to increase a propagation distance in the ultra-high frequency band.

Also being developed are various technologies for the 5G communication system to have an enhanced network, such as evolved or advanced small cell, cloud radio access network (cloud RAN), ultra-dense network, device-to-device (D2D) communication, wireless backhaul, moving network, cooperative communication, coordinated multi-point (CoMP), and interference cancellation.

There are also other various schemes under development for the 5G system including, e.g., hybrid FSK and QAM modulation (FQAM) and sliding window superposition coding (SWSC), which are advanced coding modulation (ACM) schemes, and filter bank multi-carrier (FBMC), non-orthogonal multiple access (NOMA) and sparse code multiple access (SCMA), which are advanced access schemes.

DETAILED DESCRIPTION OF THE INVENTION

Technical Problem

An electronic device (e.g., a terminal) including a radio frequency (RF) system equipped with one input/output terminal may have mounted on a main printed circuit board (PCB), a processor (e.g., an application processor (AP)), a communication circuit (e.g., a communication processor (CP) or a modem), a first communication circuit (e.g., a transceiver or a radio frequency integrated circuit (RFIC)), a second communication circuit (e.g., a front end module (FEM)), and so forth. The electronic device may perform calibration with respect to the second communication circuit (e.g., RF calibration with respect to a whole RF path immediately before input/output to/from an antenna) by connecting a coaxial cable, etc., between the second communication circuit and the antenna.

In another example, for an electronic device communicating using an ultra high frequency band (a band of several tens of GHz, e.g., 60 GHz, etc.) such as millimeter waves (mmWave), a second communication circuit may be connected, as a separate module, with an antenna without being mounted on a main PCB, and due to issues such as RF capabilities, a module size, etc., calibration may be difficult to perform by connecting a coaxial cable on the second communication circuit.

Various embodiments of the present disclosure may provide an electronic device and a method for calibrating a communication device in the electronic device, in which in an electronic device communicating using an ultra high frequency band such as millimeter waves, and calibration is performed on a second communication circuit or a communication device, thereby improving capabilities of the electronic device and reducing deviation among products of the second communication circuit or the communication device produced in module forms.

According to various embodiments of the present disclosure, in an electronic device communicating using an ultra high frequency band such as millimeter waves, a parameter generated as a result of performing calibration with respect to a second communication circuit or a communication device may be stored in the second communication circuit or the communication device (e.g., in a memory), and current or power of the second communication circuit or the communication device may be controlled by the stored parameter in communication of the electronic device including the second communication circuit or the communication device.

Technical Solution

According to an embodiment, an electronic device includes a housing, a plurality of antennas arranged on or inside the housing, a second communication circuit positioned inside the housing and electrically connected with the plurality of antennas, a first communication circuit electrically connected with the second communication circuit and configured to generate a signal in a radio frequency (RF) band (RF signal) or a signal in an intermediate frequency (IF) band (IF signal) and transmit the RF signal or the IF signal to the second communication circuit, a memory storing at least one parameter set corresponding to characteristics of the second communication circuit, and a control circuit electrically connected with the first communication circuit, in which the control circuit is configured to transmit a control signal for controlling at least one amplifier included in the second communication circuit to the second communication circuit, based on the at least one parameter stored in the memory.

According to any one of various embodiments, an operation method of an electronic device includes generating, by a first communication circuit, a signal in a radio frequency (RF) band (RF signal) or a signal in an intermediate frequency (IF) band (IF signal), transmitting the RF signal or IF signal, generated by the first communication circuit, to a second communication circuit, transmitting a control signal, generated based on at least one parameter set corresponding to characteristics of the second communication circuit, to the second communication circuit, receiving, by the second communication circuit, the control signal and controlling at least one amplifier included in the second communication circuit based on the received control signal, and transmitting, by the second communication circuit, a signal amplified by the at least one amplifier to a plurality of antennas.

Advantageous Effects

According to various embodiments, in an electronic device and an operation method of the electronic device, an electronic device communicating using an ultra high frequency band such as millimeter waves may perform calibration on a second communication circuit or a communication device, thereby improving capabilities of the electronic device or the communication device and reducing deviation among products of the communication device produced in module forms.

According to various embodiments, in an electronic device and an operation method of the electronic device, an electronic device communicating using an ultra high frequency band such as millimeter waves may perform calibration on a second communication circuit or a communication device and control current or power of the second communication circuit or the communication device to correspond to characteristics of the second communication circuit or the communication device, thereby improving capabilities of the electronic device and reducing deviation among products of the communication device produced in module forms.

BRIEF DESCRIPTION OF DRAWINGS

FIG. 27 is a block diagram of an electronic device in a network environment according to various embodiments.

MODE FOR CARRYING OUT THE INVENTION

Figure 1:
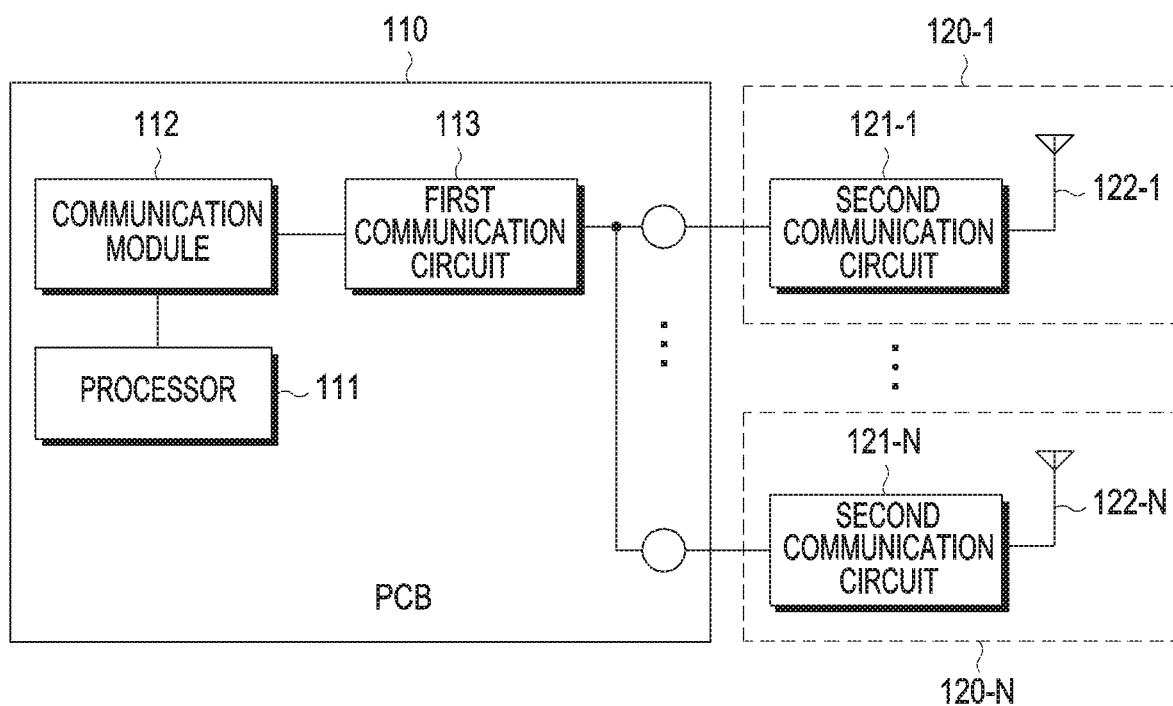
FIG. 1 is a block diagram of an electronic device according to various embodiments of the present disclosure.

Hereinafter, various embodiments of the present disclosure will be disclosed with reference to the accompanying drawings. However, embodiments and terms used therein are not intended to limit the present disclosure to particular embodiments, and it should be construed as including various modifications, equivalents, and/or alternatives according to the embodiments of the present disclosure. With regard to the description of the drawings, similar reference numerals may be used to refer to similar or related elements. It is to be understood that a singular form of a noun corresponding to an item may include one or more of the things, unless the relevant context clearly indicates otherwise. In the present disclosure, an expression such as "A or B," "A/B", "at least one of A or/and B,", etc. may include all possible combinations of together listed items. As used herein, such terms as "1st" and "2nd," or "first" and "second" may be used to simply distinguish a corresponding component from another, and does not limit the components in other aspect (e.g., importance or order). When it is described that an element (such as a first element) is "operatively or communicatively coupled with/to" or "connected" to another element (such as a second element), the element can be directly connected to the other element or can be connected to the other element through another element (e.g., a third element). The term "plural or a plurality of" may mean at least two.

An expression "configured to (or set)" used in the present disclosure may be replaced with, for example, "suitable for," "having the capacity to," "adapted to," "made to," "capable of," or "designed to" according to a situation. Alternatively, in some situation, an expression "apparatus configured to" may mean that the apparatus "can" operate together with another apparatus or component. For example, a phrase "a processor configured (or set) to perform A, B, and C" may be a dedicated processor (e.g., an embedded processor) for performing a corresponding operation or a generic-purpose processor (such as a central processing unit (CPU) or an application processor) that can perform a corresponding operation by executing at least one software program stored at a memory device.

An electronic device according to various embodiments of the present disclosure may include at least one of, for example, a smartphone, a tablet personal computer (PC), a mobile phone, a video phone, an electronic-book (e-book) reader, a desktop PC, a laptop PC, a netbook computer, a workstation, a server, a personal digital assistant (PDA), a portable multimedia player (PMP), an MP3 player, a mobile medical equipment, a camera, or an HMD device. The HMD device may include at least one of an accessory-type device (e.g., a watch, a ring, a bracelet, an anklet, a necklace, glasses, contact lenses, a head mounted device (HMD), or a head mounted display (HMD)), a fabric- or clothes-integrated device (e.g., electronic clothes), a body attaching-type device (e.g., a skin pad or tattoo), or a body implantable device. In some embodiments, the electronic device may include, for example, at least one of a television (TV), a digital video disk (DVD) player, audio equipment, a refrigerator, an air conditioner, a vacuum cleaner, an oven, a microwave oven, a laundry machine, an air cleaner, a set-top box, a home automation control panel, a security control panel, a media box (e.g., Samsung HomeSync™, Apple TV™, or Google TV™), a game console (e.g., Xbox™ or PlayStation™), an electronic dictionary, an electronic key, a camcorder, or an electronic frame.

In other embodiments, the electronic device may include at least one of various medical equipment (for example, various portable medical measurement devices (blood glucose meter, a heart rate measuring device, a blood pressure measuring device, a body temperature measuring device, etc.), magnetic resonance angiography (MRA), magnetic resonance imaging (MRI), computed tomography (CT), an imaging device, or an ultrasonic device), a navigation system, a global navigation satellite system (GNSS), an event data recorder (EDR), a flight data recorder (FDR), a vehicle infotainment device, electronic equipment for ships (e.g., a navigation system and gyro compass for ships), avionics, a security device, a vehicle head unit, an industrial or home robot, a drone, an automatic teller's machine (ATM), a point of sales (POS), Internet of things (e.g., electric bulbs, various sensors, electricity or gas meters, sprinkler devices, fire alarm devices, thermostats, streetlights, toasters, exercise machines, hot-water tanks, heaters, boilers, and so forth). According to some embodiments, the electronic device may include a part of furniture, building/structure or a part of a vehicle, an electronic board, an electronic signature receiving device, a projector, and various measuring instruments (e.g., a water, electricity, gas, electric wave measuring device, etc.). The electronic device according to various embodiments of the present disclosure may be one of the above-listed devices or a combination thereof. The electronic device according to some embodiments may be a flexible electronic device. The electronic device according to various embodiments of the present disclosure is not limited to the above-listed devices and may include new electronic devices according to technical development.

According to various embodiments of the present disclosure, a method for performing calibration on a second communication circuit or a communication device in an electronic device (e.g., an electronic device communicating using an ultra high frequency band such as millimeter waves) and the electronic device are disclosed.

According to various embodiments of the present disclosure, after calibration is performed on a second communication circuit or a communication device in an electronic device (e.g., an electronic device communicating using an ultra high frequency band such as millimeter waves), a parameter generated as a result of the calibration may be stored in the second communication circuit or the communication device (e.g., in a memory). According to various embodiments, when communication is performed in the electronic device including the second communication circuit or the communication device, the electronic device may control current or power of the second communication circuit or the communication device using the stored parameter.

Various embodiments of the present disclosure may be applied to various types of electronic devices, as a technique for providing calibration in an electronic device communicating using an ultra high frequency band such as millimeter waves. In the following description of various embodiments of the present disclosure, a device according to various embodiments of the present disclosure is described as performing communication, for example, in an ultra high frequency (e.g., mmWave) band for $5^{th}$-Generation (5G) communication, but the present disclosure is not limited to a detailed communication type, and at least some embodiments of the present disclosure may be applied in a device for transmitting a radio signal in various bands through at least two antennas.

Herein, a wireless communication network may be a specific node in the wireless communication network. For example, the wireless communication network may be a base station of the wireless communication network, a subscriber information management node, a mobility management node, etc.

Herein, the wireless communication network may include a home location register (HLR) server and an authentication center (AuC) server connected to a terminal to perform a subscriber authentication function, and may include a network and a server connected after authentication to provide voice communication or data communication.

The term "electronic device" or "user equipment (UE)" used herein may be referred to as a mobile station (MS), a terminal, a user terminal (UT), a wireless terminal, an access terminal (AT), a terminal, a subscriber unit (SU), a subscriber station (SS), a wireless device, a wireless communication device, a wireless transmit/receive unit (WTRU), a mobile node, a mobile, or other terms. Various embodiments of the terminal may include a cellular phone, a smart phone having a wireless communication function, a tablet having a wireless communication function, a wearable device having a wireless communication function, a personal digital assistant (PDA) having a wireless communication function, a wireless modem, a portable computer having a wireless communication function, a photographing device having a wireless communication function, such as a digital camera, a gaming device having a wireless communication function, a music storage and play home appliance having a wireless communication function and an Internet home appliance capable of wireless Internet connection and browsing, and portable units or terminals having integrated therein combinations of such functions. In addition, an instrument having a communication function may be included in the electronic device or the terminal.

Herein, the electronic device or the terminal may also include, but not limited to, a machine-to-machine (M2M) terminal and a machine type communication (MTC) terminal/device.

FIG. 1 is a block diagram of an electronic device according to various embodiments of the present disclosure. Referring to FIG. 1, an electronic device according to various embodiments of the present disclosure may include a printed circuit board (PCB) (e.g., a main PCB) 110, and communication devices 120-1 through 120-N of at least one (e.g., a plurality of (e.g., four)) communication device. Each communication device 120 may include a second communication circuit 121 and an array antenna 122. Each array antenna 122 may include a plurality of antenna elements.

According to an embodiment, on the PCB 110, a processor 111 (e.g., an application processor (AP)), a communication module 112 (e.g., a communication processor (CP) or a first communication circuit (e.g., a radio frequency integrated circuit (RFIC) or an intermediate frequency IC (IFIC)), or a transceiver 113 may be mounted or arranged.

According to an embodiment, the processor 111 may drive, e.g., software (e.g., a program) to control at least one other component (e.g., a hardware or software component) of the electronic device connected with the processor 111 and may process or compute various data. The processor 111 may load a command or data received from other elements (e.g., the communication module 112) into a memory to process the command or data, and store result data in the memory.

According to an embodiment, the communication module 112 may support establishing a wired or wireless communication channel between an electronic device and an external electronic device and performing communication via the established communication channel. The communication module 112 may include one or more communication processors that are operated independently from the processor 111 (e.g., an application processor) and support wired or wireless communication. According to an embodiment, the communication module 112 may include a cellular communication module, a short-range wireless communication module, a GNSS communication module, a long term evolution (LTE) communication module, an LTE-advanced (LTE-A) communication module, a code division multiple access (CDMA) communication, a wideband CDMA (WCDMA) communication module, a universal mobile telecommunication system (UMTS) communication module, a wireless broadband (WiBro) communication module, a global system for mobile communications (GSM) communication module, a 5G communication module, etc., a wireless communication module (e.g., a local area network (LAN) communication module), a power-line communication module, and may communicate with the external electronic device via a first network (e.g., a short-range communication network, such as Bluetooth™, wireless-fidelity (Wi-Fi) direct, or infrared data association (IrDA)) or a second network (e.g., a long-range communication network, such as a cellular network, the Internet, or a computer network (e.g., an LAN or wide area network (WAN)). The above-enumerated types of communication modules 112 may be implemented in a single chip, where at least some of the modules are integrated, or individually in separate chips.

According to various embodiments, the processor 111 and the communication module 112 may be implemented in a single chip, and at least some function of the processor 111 and at least some function of the communication module 112 may be implemented in one chip.

According to an embodiment, the first communication circuit 113 may include a modulator or a demodulator. For example, the first communication circuit 113 may modulate a transmission signal generated in the communication module 112 or the processor 111 into a signal of a radio frequency (RF) band (RF signal) or a signal of an intermediate frequency (IF) band (IF signal) through the modulator. The first communication circuit 113 may demodulate the RF signal or IF signal received through the plurality of second communication circuits 121-1 through 121-n into a baseband signal through the demodulator.

According to various embodiments, each second communication circuit 121 of the plurality of second communication circuits 121-1 through 121-N may receive and amplify and/or wireless-signal process the RF signal modulated by the first communication circuit 113, and transmit the result signal to a radio space through each array antenna 122. According to various embodiments, the second communication circuit 121 may receive the IF signal modulated by the first communication circuit 113 and convert the IF signal into the RF signal, and then amplify and/or wireless-signal process the converted signal and transmit the result signal to the radio space through the array antenna 122.

According to various embodiments, the second communication circuit 121 and each array antenna 122 including a plurality of antenna elements may be formed as at least one module, and the formed module may be referred to as the 'communication device 120'. According to various embodiments, the communication device 120 including the second communication circuit 121 and the antenna array 122 may be formed as an independent separate device, module, or circuit, and at least some thereof may be included in the PCB 110.

According to various embodiments of the present disclosure, the communication device 120 may be modulized to perform calibration according to characteristics of each module or verify a defect of each module. According to various embodiments, at least one parameter generated as a result of calibration on the communication device 120 may be stored in a memory of the communication device 120. According to various embodiments, when the communication device 120 is mounted in the electronic device and performs wireless communication, the communication device 120 may be controlled using the stored parameter, thereby improving capabilities of the electronic device and reducing deviation between products of the communication device 120 manufactured in a module form. According to various embodiments, the communication device 120 manufactured in the module form may include an mmWave array antenna using an ultra high frequency band such as millimeter waves.

Calibration with respect to the communication device 120 needs to be performed at a stage previous to the array antenna 122, such that when the communication device 120 is formed as a separate module without being included in the PCB 110 as shown in FIG. 1, calibration using a coaxial cable may be difficult to perform. According to various embodiments, an mmWave communication device may include an array antenna including a plurality of antenna elements, in which a size of each antenna element is too small to set a calibration point for each antenna element. For example, when a calibration point is set in the middle of a transmission path of the mmWave communication device and calibration is performed, a signal sensitively changes with a probe or a cable due to characteristics of an mmWave frequency, making it difficult to perform normal calibration.

Figure 2:
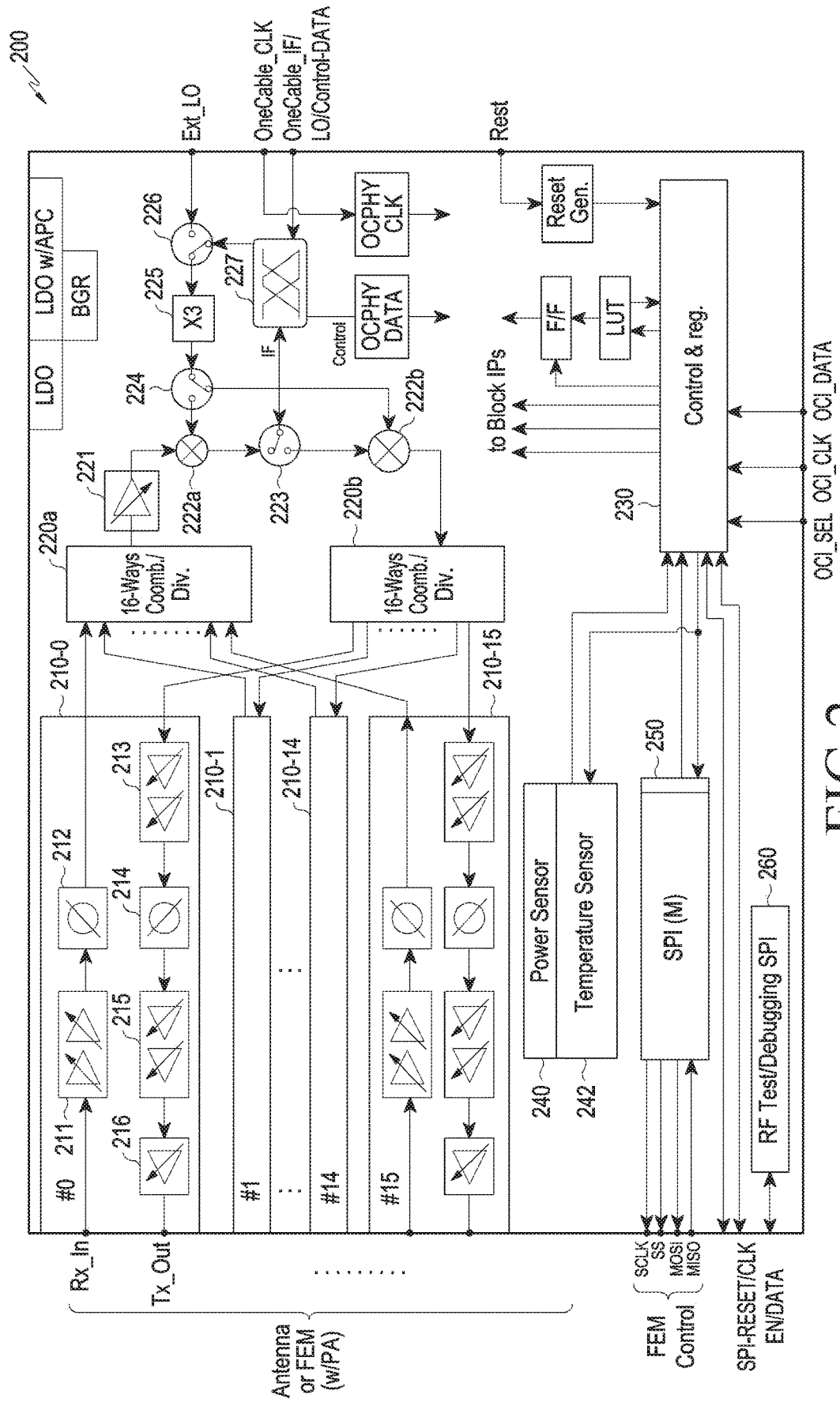
FIG. 2 is a circuit diagram illustrating a structure of a second communication circuit, according to various embodiments of the present disclosure.

FIG. 2 is a circuit diagram illustrating a structure of a second communication circuit, according to various embodiments of the present disclosure. A second communication circuit 200 (e.g., the second communication circuit 121 of FIG. 1) according to various embodiments of the present disclosure may include at least one of a transmission/reception signal processing circuit 210, a combiner 220a, a divider 220b, a receive bi-directional amplifier (RBDA) 221, a reception mixer 222a, a transmission mixer 222b, transmission/reception transition switches 223 and 224, a local oscillator 225, a transition switch 226, a signal divider 227, a controller 230, a power sensor 240, a temperature sensor 242, a serial peripheral interface (SPI) 250, or an RF test SPI 260.

According to various embodiments, the transmission/reception signal processing circuit 210 may include a plurality of (e.g., 16) transmission/reception signal processing circuits 210-0 through 210-15 depending on the number of antenna elements. Each transmission/reception signal processing circuit 210 may be connected to each antenna element. According to various embodiments, each transmission/reception signal processing circuit 210 may include at least one of a low noise amplifier (LNA) 211, a phase shifter (PS) 212, a phase shifter drive amplifier (PSDA) 213, a PS 214, a pre-power amplifier (PPA) 215, or a power amplifier (PA) 216.

According to various embodiments, the second communication circuit 200 supporting an ultra high frequency band may execute a reception function of converting an RF signal in an mmWave band, input from each array antenna (e.g., the array antenna 122 of FIG. 1) into an IF signal and transferring the IF signal to a next RF stage (e.g., the first communication circuit 113 of FIG. 1) and a transmission function of converting an IF signal input from the RF stage (e.g., the first communication circuit 113 of FIG. 1) into an RF signal in the mmWave band and transferring the RF signal to an array antenna (e.g., the array antenna 122 of FIG. 1).

According to various embodiments, the second communication circuit 200 or the transmission/reception signal processing circuit 210 may have a transmission (TX) path and a reception (RX) path to transmit and receive an ultra high frequency radio signal in a time-division multiple access (TDMA) manner. For example, in the transmission/reception signal processing circuit 210, a transmission path may include at least one of the PSDA 213, the PS 214, the PPA 215, or the PA 216, and a reception path may include at least one of the LNA 211 or the PS 212.

The LNA 211 may be positioned at a stage next to an antenna and may be a low-noise amplifier designed to amplify a received RF signal and to optimize total system noise performance. The PS 212 may function to change a phase of an input signal, and may change a phase of 0-360 degrees at intervals of 22.5 degrees into a total of 16 stages for 4 bits.

The PSDA 213 may be positioned at a transmission stage in a multi-chain RF system for a phased array system, and execute an amplification function for compensating for a loss of a power divider located front/back and a loss occurring in a PS. The PS 214 may function to change a phase of an input signal, and may change a phase of 0-360 degrees at intervals of 22.5 degrees into a total of 16 stages for 4 bits.

The PPA 215 may include an amplifier positioned in front of the PA 216 to vary a strength of a signal input to the PA 216. The PA 216 may include an amplifier positioned in a transmitter terminal to amplify an RF signal, minimize distortion of an output signal, and maintain high-efficiency characteristics. According to various embodiments, a power level detection circuit such as a transmitted signal strength indicator (TSSI) may be embedded in a terminal of the PA 216.

Each transmission/reception signal processing circuit 210 of the second communication circuit 200 may be connected with each of the plurality of antenna elements forming the array antenna, and the array antenna connected to the transmission/reception signal processing circuit 210 may be, for example, a radiation device array (a 4×4 radiation device array) including 16 radiation devices.

According to various embodiments, the at least one RF transmission/reception signal processing circuit 210 may include a plurality of, for example, 16 transmission/reception signal processing circuits 210-0, . . . , 210-15 to process transmission/reception signals for each antenna element. According to various embodiments, between the transmission/reception transition switches 223 and 224 and the plurality of transmission/reception signal processing circuits 210-0 through 210-5 is provided the combiner 220a implemented as, for example, a 16-way combiner/divider, to combine reception signals of the respective reception paths of the 16 transmission/reception signal processing circuits 210-1 through 210-15. According to various embodiments, the divider 220b implemented as, for example, a 16-way combiner/divider, may also be provided to divide transmission signals through the respective transmission paths of the 16 transmission/reception signal processing circuits 210-0 through 210-15.

According to various embodiments, each of the plurality of transmission/reception signal processing circuits 210-0 through 210-15 may include the PA 216 for amplifying a transmission signal, the transmission PS 214 for changing a phase of a transmission signal for beam-forming, the LNA 211 for amplifying a reception signal, the reception PS 212 for changing a phase of a reception signal for beam-forming, or the like. According to various embodiments, a configuration and an installation position of an amplification stage for amplifying transmission and reception signals in the second communication circuit 200 may be various. According to various embodiments, the second communication circuit 200 or the transmission/reception signal processing circuit 210 may further include a filter for filtering each of a transmission signal and a reception signal.

According to various embodiments, the second communication circuit 200 may include a frequency up/down converter for up-converting a transmission signal (e.g., an IF signal) transmitted from the first communication circuit (e.g., the first communication circuit 113 of FIG. 1) into a radio signal (e.g., an RF signal) in an ultra high frequency band or down-converting a reception signal in the ultra high frequency band into an IF signal. For example, the frequency up/down converter may include the local oscillator 225, the reception mixer 222a, the transmission mixer 222b, or the like. According to various embodiments, when the first communication circuit (e.g., the first communication circuit 113 of FIG. 1) is formed to transmit a signal in an ultra high frequency band for wireless transmission, the second communication circuit 200 may not include the frequency up/down converter.

According to various embodiments, the local signal generator 225 of the frequency up/down converter that may be included in the second communication circuit 200 may be configured to generate a local signal therein, but may also be configured to generate a local signal LO_A by using (e.g., frequency multiplication) a reference local signal transmitted from the first communication circuit included in a main PCB for signal synchronization. For example, an IF signal may have 11.x GHz (e.g., 11.2 GHz), a reference local signal may have 5.x GHz (e.g., 5.6 GHz), and the local oscillator 225 may generate a wirelessly transmitted ultra high frequency signal (e.g., 28 GHz) by using a local signal (e.g., 16.8 GHz) resulting from three-time multiplication of the reference local signal. The reference local signal may be between, for example, 5 and 6 GHz. The IF signal may be between, for example, 10 and 12 GHz. The wirelessly transmitted ultra high frequency signal may be between, for example, 25 and 30 GHz.

According to various embodiments, a signal sensed in the power sensor 240 or the temperature sensor 242 may be provided to the controller 230. The controller 230 may transmit a control signal based on the sensing value to each function value that requires the sensing value. The SPI 250 may provide a serial communication interface with a peripheral device, and transmit data received from the peripheral device to the controller 230 or a control signal received from the controller 230 to each peripheral device. The RF test SPI 260 may provide an interface for testing or debugging of the second communication circuit 200.

According to various embodiments, the second communication circuit 200 may include the controller 230 for controlling an operation of the second communication circuit 200. The controller 230 may be provided with a control signal from the first communication circuit (e.g., the first communication circuit 113 of FIG. 1) and perform transmission/reception switching control and beam-forming control in the second communication circuit 200. According to various embodiments, the controller 230 may be configured to receive a control signal from a communication module (e.g., the communication module 112 of FIG. 1) or a separate processor (e.g., the processor 111 of FIG. 1).

According to various embodiments, the signal provided from the first communication circuit to the second communication circuit 200 may include an IF signal, a reference local signal, and a control signal. For example, the signals may be implemented in different frequency bands and thus may be provided as a frequency signal by being combined through one coaxial cable. The second communication circuit 200 may include the signal divider 227 having a filter combiner/divider structure for dividing the frequency-combined signal provided from the first communication circuit into the IF signal, the reference local signal, and the control signal. For example, when the IF signal has 11.2 GHz and the reference local signal has 5.6 GHz, the control signal may be designed to have 2 GHz or lower. The signal divider 227 may include a triplexer for frequency-dividing/combining, for example, the IF signal, the reference local signal, and the control signal, and may include a plurality of filters (e.g., a low band filter, a high band filter, a bandpass filter, etc.).

Hereinbelow, referring to FIGS. 3 through 6, a configuration example of each element of a transmission path in the transmission/reception signal processing circuit 210 of the second communication circuit 200 will be described.

Figure 3:
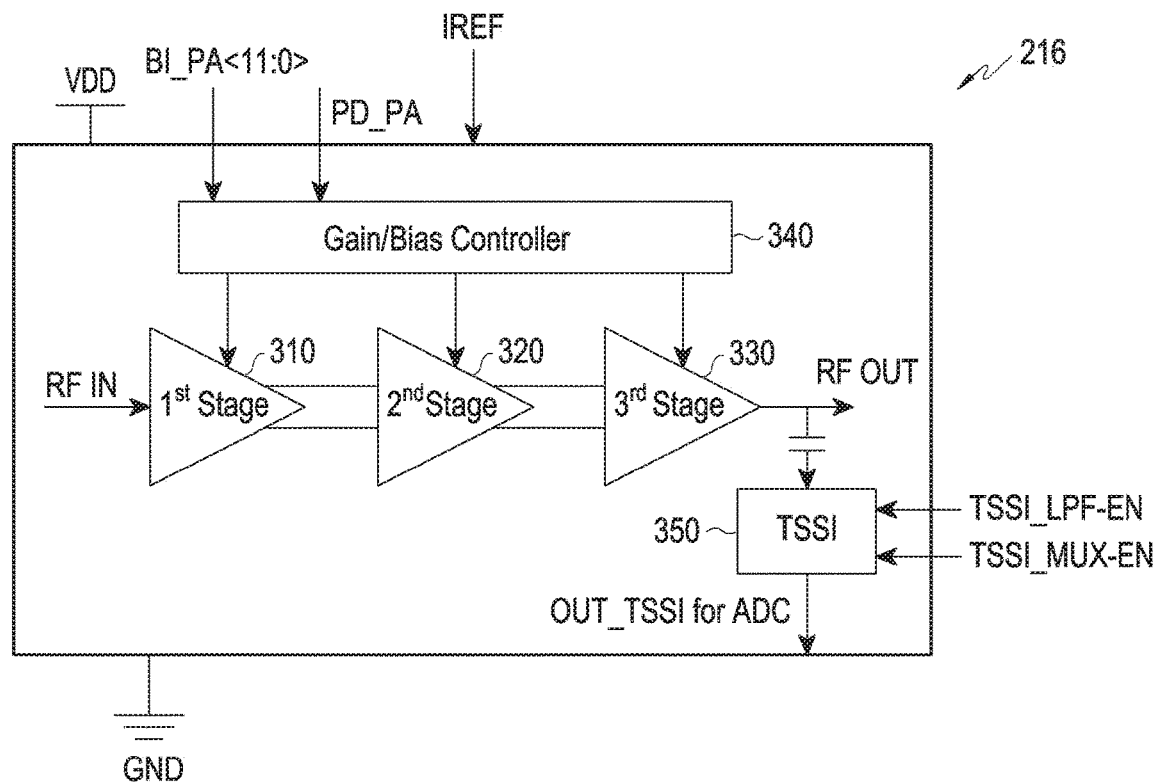
FIG. 3 is a circuit diagram illustrating a structure of a power amplifier, according to various embodiments of the present disclosure.

FIG. 3 is a circuit diagram illustrating a detailed structure of a power amplifier, according to various embodiments of the present disclosure. Referring to FIG. 3, the PA 216 (e.g., the PA 216 of FIG. 2) may include at least one of a plurality of amplifiers 310, 320, and 330, a gain/bias controller 340, or a TSSI 350.

According to various embodiments, an RF signal input to the PA 216 may be amplified through the amplifiers 310, 320, and 330 of each stage, and a gain and/or a bias of each of the amplifiers 310, 320, and 330 may be controlled by the gain/bias controller 340. The gain/bias controller 340 may receive a control signal from the communication module (e.g., the communication module 112 of FIG. 1) or the processor (e.g., the processor 111 of FIG. 1) to control the gain and/or the bias of each of the amplifiers 310, 320, and 330. According to various embodiments, the control signal provided from the communication module or the processor may be generated based on a parameter stored in the memory as calibration is performed on the second communication circuit (e.g., the second communication circuit 121 of FIG. 1 or the second communication circuit 200 of FIG. 2).

According to various embodiments, a radio signal amplified by the amplifier 330 of the last stage among the plurality of amplifiers 310, 320, and 330 may be transmitted to a corresponding antenna, and may be provided to the TSSI 350 according to various embodiments. According to various embodiments, the TSSI 350 formed in a terminal of the PA 216 may be a circuit for detecting a power level, and may be used to calibrate the output power of the second communication circuit. For example, a signal output from the TSSI 350 may be provided to an analog-to-digital converter (ADC0, and may perform calibration on the second communication circuit by comparing a digital value of a TSSI level with a preset value.

Figure 4:
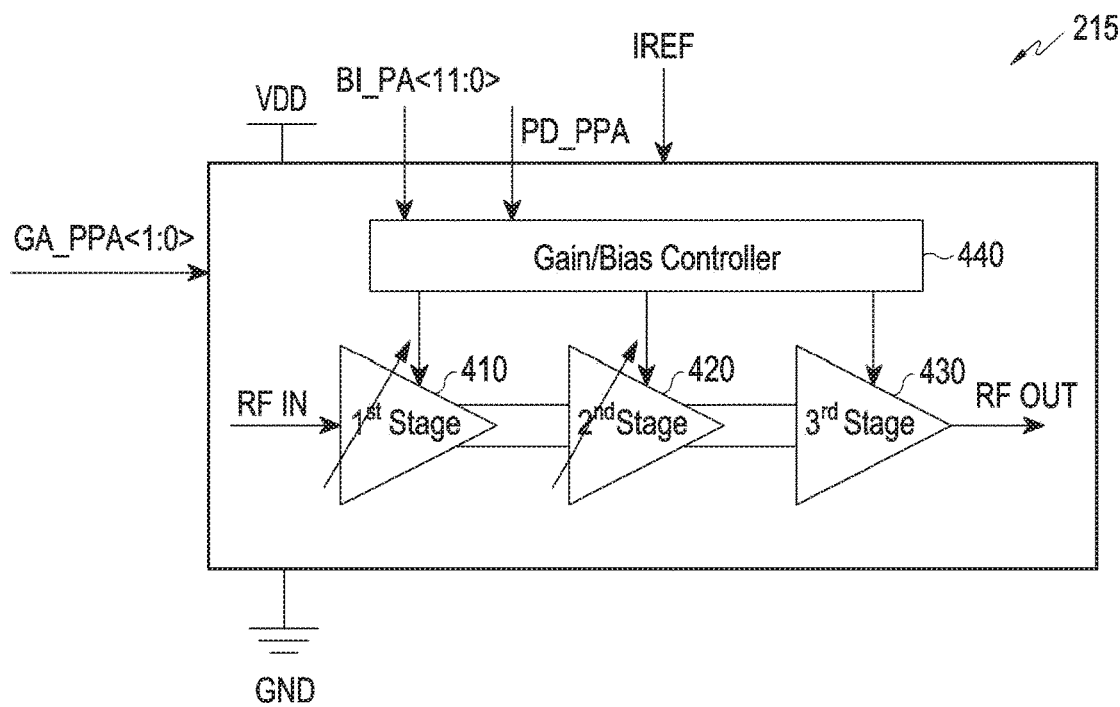
FIG. 4 is a circuit diagram illustrating a structure of a pre-processing power amplifier, according to various embodiments of the present disclosure.

FIG. 4 is a circuit diagram illustrating a detailed structure of a pre-processing power amplifier, according to various embodiments of the present disclosure. Referring to FIG. 4, the PPA 215 (e.g., the PPA 215 of FIG. 2) may include at least one of a plurality of amplifiers 410, 420, and 430 or a gain/bias controller 440.

According to various embodiments, an RF signal input to the PPA 215 may be amplified through the amplifiers 410, 420, and 430 of each stage. A gain and/or a bias of each of the amplifiers 410, 420, and 430 may be controlled by the gain/bias controller 440. The gain/bias controller 440 may receive a control signal from the communication module (e.g., the communication module 112 of FIG. 1) or the processor (e.g., the processor 111 of FIG. 1) to control the gain and/or the bias of each of the amplifiers 410, 420, and 430. According to various embodiments, the control signal provided from the communication module or the processor may be generated based on a parameter stored in the memory as calibration is performed on the second communication circuit (e.g., the second communication circuit 121 of FIG. 1 or the second communication circuit 200 of FIG. 2).

According to various embodiments, a radio signal amplified by the amplifier 430 of the last stage among the plurality of amplifiers 410, 420, and 430 may be provided to an amplifier (e.g., the amplifier 310 of FIG. 3) of the first stage among the plurality of amplifiers included in the power amplifier (e.g., the PA 216 of FIG. 3).

Figure 5:
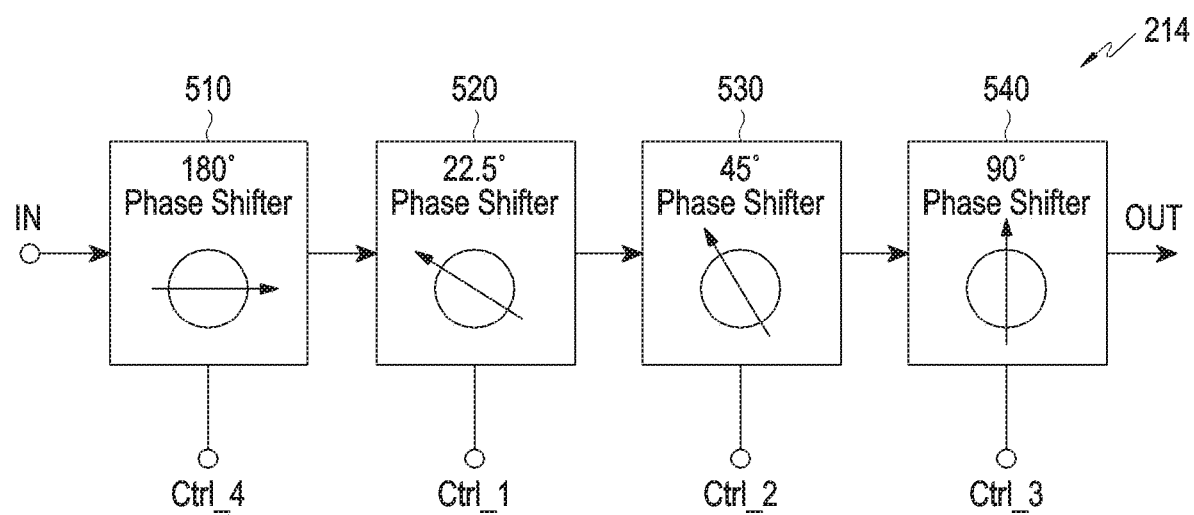
FIG. 5 is a circuit diagram illustrating a structure of a phase shifter, according to various embodiments of the present disclosure.

FIG. 5 is a circuit diagram illustrating a detailed structure of a phase shifter, according to various embodiments of the present disclosure. Referring to FIG. 5, the PS 214 (e.g., the PS 214 or the PS 212 of FIG. 2) may include at least one of a plurality of phase shifters 510, 520, 530, or 540.

According to various embodiments, the PS 214 may function to change a phase of an input signal, and may change a phase of 0-360 degrees at intervals of 22.5 degrees into a total of 16 stages for 4 bits, as shown in FIG. 5.

Figure 6:
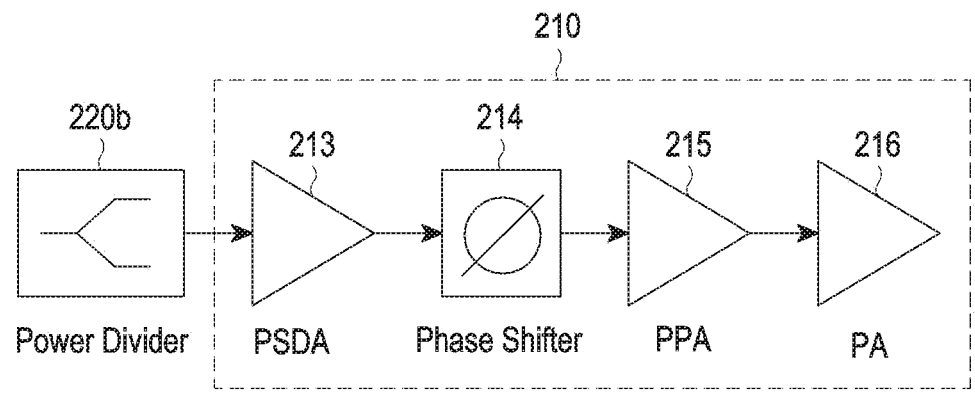
FIG. 6 illustrates a transmission signal processing circuit according to various embodiments of the present disclosure.

FIG. 6 illustrates a transmission signal processing circuit according to various embodiments of the present disclosure. Referring to FIG. 6, a transmission/reception signal processing circuit (e.g., the transmission/reception processing circuit 210 of FIG. 2) may include at least one of the PSDA 213, the PS 214, the PPA 215, or the PA 216.

According to various embodiments, the divider 220b may divide power for the transmission/reception processing circuit 210 corresponding to each antenna and provide the power to the PSDA 213 of each transmission/reception processing circuit 210. A signal provided to the PSDA 213 may be amplified and then provided to the PS 214. The PS 214 may change a phase of the received signal based on a control signal and output the phase-changed signal to the PPA 215. The PPA 215 may amplify power at a stage previous to the PA 216 and then provide the amplified signal to the PA 216. The PA 216 may amplify the signal provided from the PPA 215 and provide the amplified signal to the antenna.

According to various embodiments of the present disclosure, the control signal generated based on a parameter set through calibration may control a gain and/or a bias of at least one of the PSDA 213, the PPA 215, or the PA 216 that constitute the transmission/reception processing circuit 210. According to various embodiments, the control signal may control a gain and/or a bias for at least one amplifier included in the PSDA 213, a gain and/or a bias for at least one amplifier included in the PPA 215, or a gain and/or a bias for at least one amplifier included in the PA 216.

According to various embodiments, the parameter set through calibration may be set based on current and power measured for the entire second communication circuit 200 or may be set separately for each of the plurality of transmission/reception processing circuits 210. According to various embodiments, calibration may be performed on each of the plurality of transmission/reception processing circuits 210 connected to the plurality of antennas, and a parameter corresponding to a gain and/or a bias may be set for each of the plurality of (e.g., 16) transmission/reception processing circuits 210. According to various embodiments, power for each transmission/reception processing circuit 210, measured for calibration, may be obtained from an output signal of the PA 216 included in each transmission/reception processing circuit 210, and the designated transmission/reception processing circuit 210 may operate in calibration to sequentially measure current and/or power for each transmission/reception processing circuit 210. According to various embodiments, when calibration is performed on each transmission/reception circuit 210, each parameter may be stored in the memory to correspond to each transmission/reception processing circuit 210.

According to various embodiments of the present disclosure, an electronic device may include a housing, a plurality of antennas arranged on or inside the housing, a second communication circuit positioned inside the housing and electrically connected with the plurality of antennas, a first communication circuit electrically connected with the second communication circuit and configured to generate a signal in a radio frequency (RF) band (RF signal) or a signal in an intermediate frequency (IF) band (IF signal) and transmit the RF signal or the IF signal to the second communication circuit, a memory storing at least one parameter set corresponding to characteristics of the second communication circuit, and a control circuit electrically connected with the first communication circuit, in which the control circuit is configured to transmit a control signal for controlling at least one amplifier included in the second communication circuit to the second communication circuit, based on the at least one parameter stored in the memory.

According to various embodiments of the present disclosure, the control signal may include a signal for controlling a gain and/or a bias of the at least one amplifier included in the second communication circuit.

According to various embodiments of the present disclosure, the electronic device may further include a communication device arranged inside the housing, in which the communication device includes the plurality of antennas and the second communication circuit.

According to various embodiments of the present disclosure, the memory may be included in the communication device.

According to various embodiments of the present disclosure, the second communication circuit may include at least one of a phase shifter drive amplifier (PSDA), a phase shifter (PS), a pre-power amplifier (PPA), or a power amplifier (PA).

According to various embodiments of the present disclosure, the control signal may include a signal for controlling a gain and/or a bias of at least one of the PSDA, the PPA, or the PA.

According to various embodiments of the present disclosure, the control signal may include a signal for controlling a gain and/or a bias of at least one amplifier included in the PSDA, a gain and/or a bias of at least one amplifier included in the PPA, or a gain and/or a bias of at least one amplifier included in the PA.

According to various embodiments of the present disclosure, the electronic device may further include a printed circuit board (PCB) arranged inside the housing, in which the first communication circuit and the control circuit are included in the PCB.

According to various embodiments of the present disclosure, the electronic device may further include a first memory included in the second communication circuit and a second memory arranged on the PCB, in which the control circuit is configured to receive the at least one parameter stored in the memory and store the received at least one parameter in the second memory.

According to various embodiments of the present disclosure, the IF signal may correspond to a frequency between 8 GHz and 12 GHz and may be a frequency between an RF frequency and a local oscillator (LO) frequency (e.g., 5.x GHz). According to various embodiments, the RF signal may correspond to a frequency between 25 GHz to 60 GHz.

Hereinbelow, a method for performing calibration on the communication device according to various embodiments of the present disclosure will be described.

Figure 7:
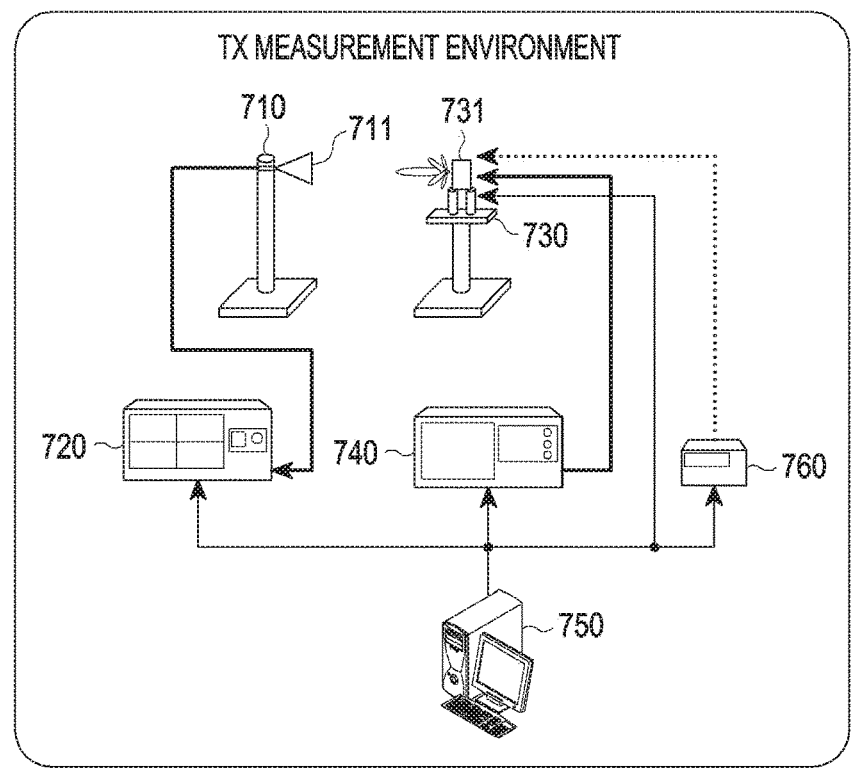
FIG. 7 illustrates a transmission (TX) measurement environment for calibration, according to various embodiments of the present disclosure.
Figure 8:
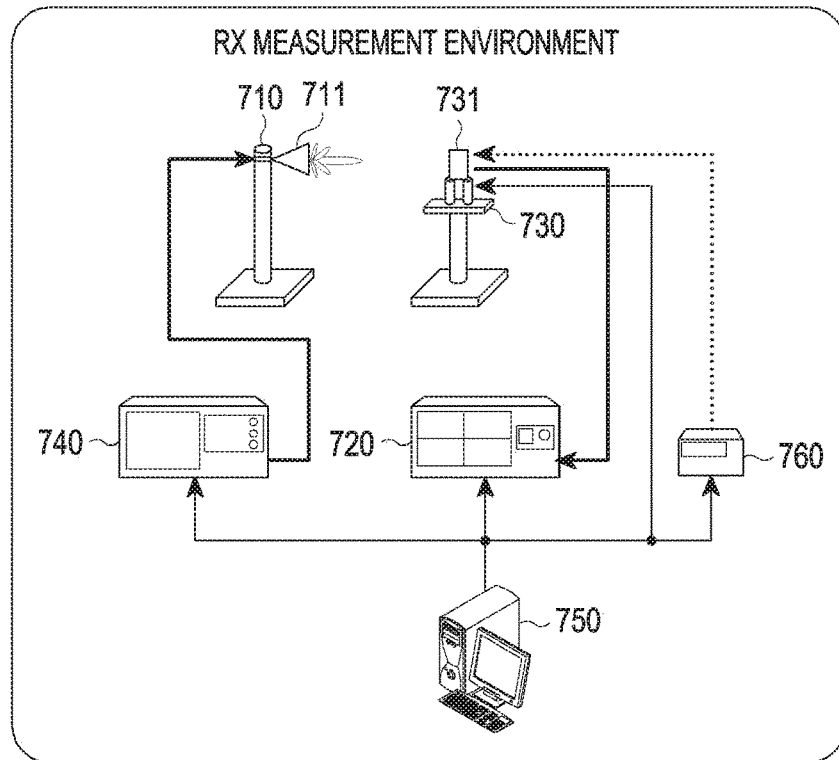
FIG. 8 illustrates a reception (RX) measurement environment for calibration, according to various embodiments of the present disclosure.

FIG. 7 illustrates a transmission (TX) measurement environment for calibration, according to various embodiments of the present disclosure, and FIG. 8 illustrates a reception (RX) measurement environment for calibration, according to various embodiments of the present disclosure. Referring to FIG. 7, to calibrate a communication device 731 (e.g., the communication device 120 of FIG. 1), at least one of a PC 750, a signal generator 740, a signal analyzer 720, or a power supply 760 may be used.

According to various embodiments, the communication device 731 in a module form may be fixed on a cradle 730, and a horn antenna 711 may be fixed on a cradle 710 to correspond to the communication device 731.

Referring to FIG. 7, in the TX measurement environment, a control signal generated through the PC 750 may be transmitted to the signal generator 740 that may generate a corresponding RF signal or IF signal based on the control signal transmitted from the PC 750. The RF signal or IF signal generated by the signal generator 740 may be provided to the communication device 731 placed on the cradle 730. The communication device 731 may include a second communication circuit (e.g., the second communication circuit 121 of FIG. 1 or the second communication circuit 200 of FIG. 2) and a plurality of array antennas (e.g., the array antenna 122 of FIG. 1). The communication device 731 may be provided with the RF signal or the IF signal from the signal generator 740 and transmit the RF signal or IF signal over the air (OTA) through the array antenna 122. The power supply 760 may supply power to each module (e.g., the PC 750, the signal generator 740, the signal analyzer 720, or the communication device 731) and may measure current consumed in each module based on the supplied power.

The horn antenna 711 fixed on the cradle 710 to correspond to the communication device 731 may receive the RF signal transmitted from the communication device 731 and provide the RF signal received by the horn antenna 711 to the signal analyzer 720. The signal analyzer 720 may analyze the RF signal received by the horn antenna 711 and perform calibration on the communication device 731.

Referring to FIG. 8, in the RX measurement environment, a control signal generated through the PC 750 may be transmitted to the signal generator 740 that may generate a corresponding RF signal or IF signal based on the control signal transmitted from the PC 750. The RF signal or IF signal generated by the signal generator 740 may be provided to the horn antenna 711 placed on the cradle 710. The horn antenna 711 may transmit the RF signal over the air (OTA).

The communication device 731 may include at least one array antenna (e.g., the array antenna 122 of FIG. 1) through which the communication device 731 may receive the RF signal transmitted from the horn antenna 711. The RF signal received by the communication device 731 may be provided to the signal analyzer 720. The signal analyzer 720 may analyze the RF signal received by the communication device 731 and perform calibration on the communication device 731.

According to various embodiments, as shown in FIGS. 7 and 8, by alternately measuring transmission and reception of an mmWave RF signal, calibration may be performed.

Figure 9:
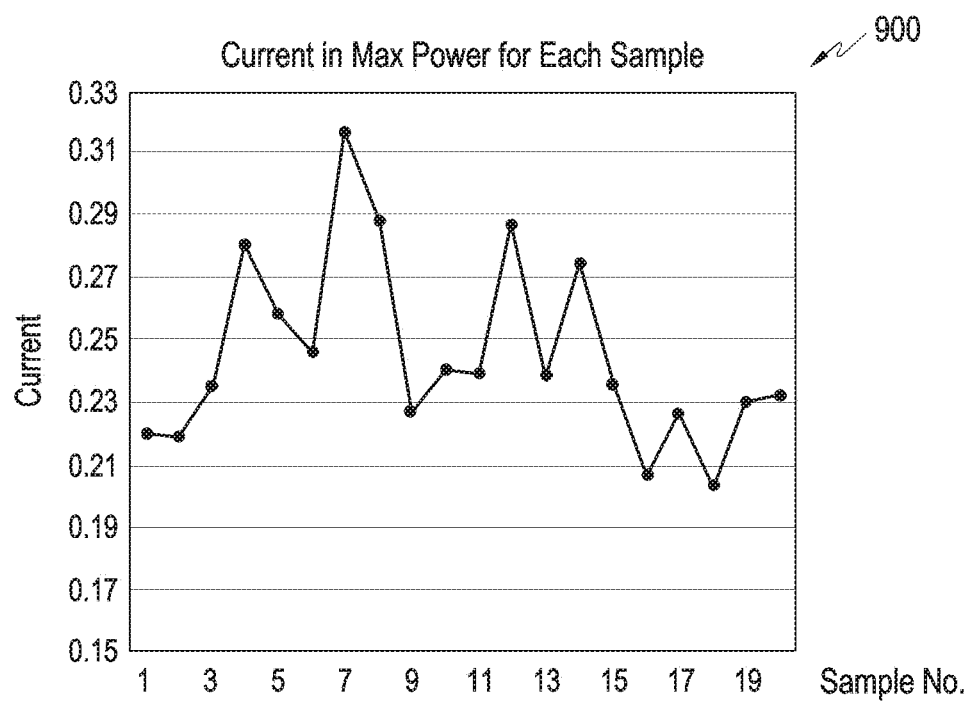
FIG. 9 is a graph showing current in maximum power for each sample, according to various embodiments of the present disclosure.
Figure 10:
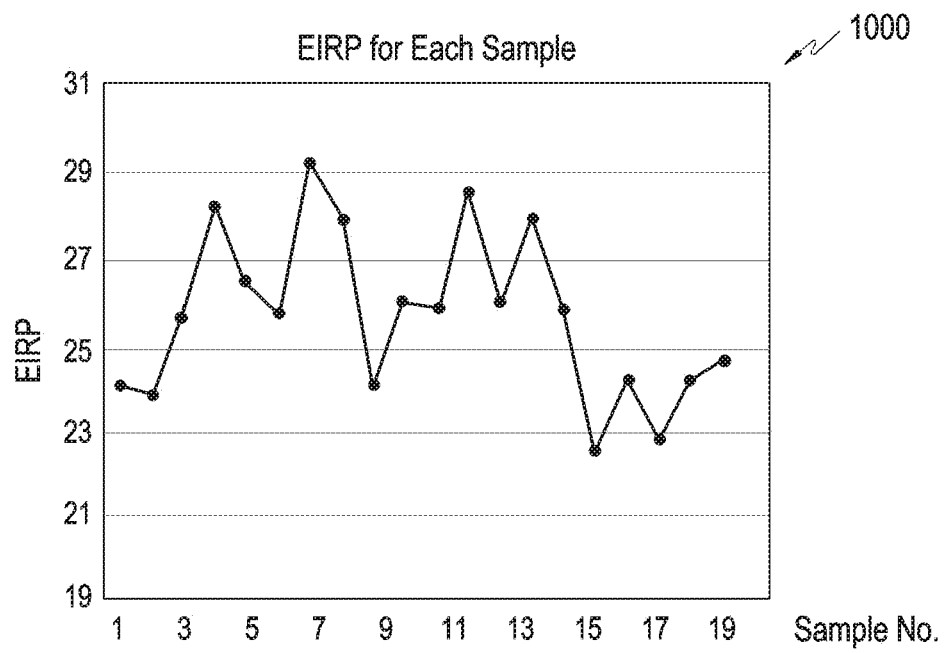
FIG. 10 is a graph showing an effective isotopically radiated power (EIRP) for each sample, according to various embodiments of the present disclosure.

Results measured by the method may be expressed as Table 1 and may be expressed graphs shown in FIGS. 9 and 10.

TABLE 1

| Sample No. | Initial Value | |
|---|---|---|
| | Current (A) | EIRP(dBm) |
| 1 | 0.22 | 23.99 |
| 2 | 0.219 | 23.87 |
| 3 | 0.235 | 25.60 |
| 4 | 0.28 | 28.26 |
| 5 | 0.259 | 26.44 |
| 6 | 0.246 | 25.71 |
| 7 | 0.316 | 29.14 |
| 8 | 0.288 | 27.98 |

TABLE 1-continued

| Sample No. | Initial Value | |
|---|---|---|
| | Current (A) | EIRP(dBm) |
| 9 | 0.228 | 24.03 |
| 10 | 0.24 | 25.97 |
| 11 | 0.239 | 25.87 |
| 12 | 0.286 | 28.57 |
| 13 | 0.24 | 25.94 |
| 14 | 0.274 | 27.91 |
| 15 | 0.236 | 25.84 |
| 16 | 0.208 | 22.58 |
| 17 | 0.226 | 24.13 |
| 18 | 0.203 | 22.90 |
| 19 | 0.23 | 24.12 |
| 20 | 0.232 | 24.60 |
| Average (avg) | 0.24525 | 25.6716 |
| Minimum Value (min) | 0.203 | 22.582 |
| Maximum Value (max) | 0.316 | 29.139 |

FIG. 9 is a graph 900 showing current in maximum power for each sample according to various embodiments of the present disclosure, and FIG. 10 is a graph 1000 showing an effective isotopically radiated power (EIRP) for each sample according to various embodiments of the present disclosure.

Referring to FIGS. 9 and 10, as a result of measurement with respect to 20 samples by the method shown in FIGS. 7 and 8 according to various embodiments, calibration has not yet been performed, such that it may be seen that a difference of 6.5 dBm or more is generated between a minimum value and a maximum value of an EIRP. It may be analyzed that the EIRP difference may be generated due to various reasons such as design complexity, doping concentration change, bias voltage change, etc., in designing and manufacturing of the second communication circuit or the communication device. According to various embodiments of the present disclosure, by performing calibration, the generated EIRP difference may be reduced, and the EIRP may have a value within a specific range regardless of the second communication circuit or the communication device, thereby improving reliability of the second communication circuit or the communication device.

Hereinbelow, referring to FIGS. 11 to 14, a description will be made of a calibration method according to various embodiments of the present disclosure.

Figure 11:
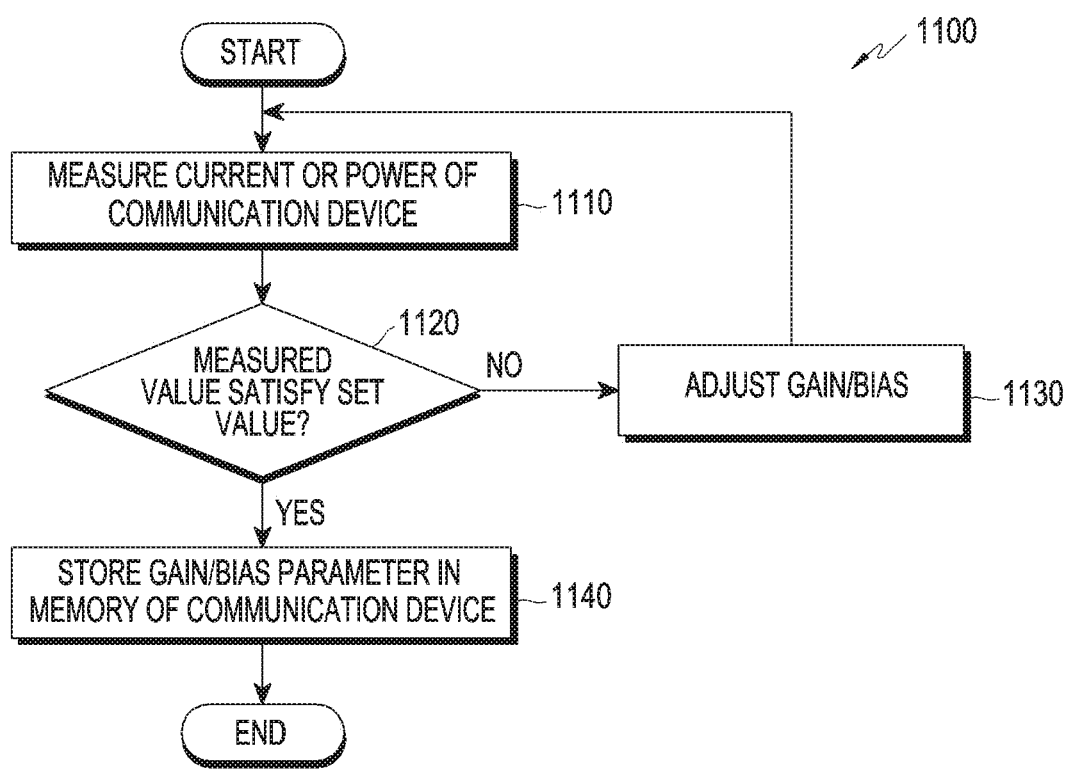
FIG. 11 is a flowchart of a calibration method in an electronic device, according to various embodiments of the present disclosure.

FIG. 11 is a flowchart of a calibration method in an electronic device, according to various embodiments of the present disclosure. To perform calibration, a measurement environment for the communication device shown in FIG. 7 or 8 may be set up.

Referring to FIG. 11, in operation 1110, the electronic device (e.g., an electronic device 2701 of FIG. 27) may apply an RF signal or an IF signal to the communication device (e.g., the communication device 731 of FIG. 7) and measure power or current flowing in the communication device.

When a value measured as a result of the measurement does not satisfy a preset condition (e.g., the measured value falls beyond a reference range for calibration) in operation 1120, the electronic device may adjust a gain and/or a bias in operation 1130.

When current or power flowing in the communication device is measured in operation 1110, the measured value may change with adjustment of the gain or the bias. When the changed measured value satisfies the preset condition in operation 1120, a parameter corresponding to a gain and/or a bias in case of satisfaction with the preset condition may be stored in the memory of the communication device in operation 1140.

According to various embodiments of the present disclosure, when the electronic device including the communication device performs communication, the electronic device may control current or power of the communication device by using a parameter stored as a result of performing calibration on the communication device.

Figure 12:
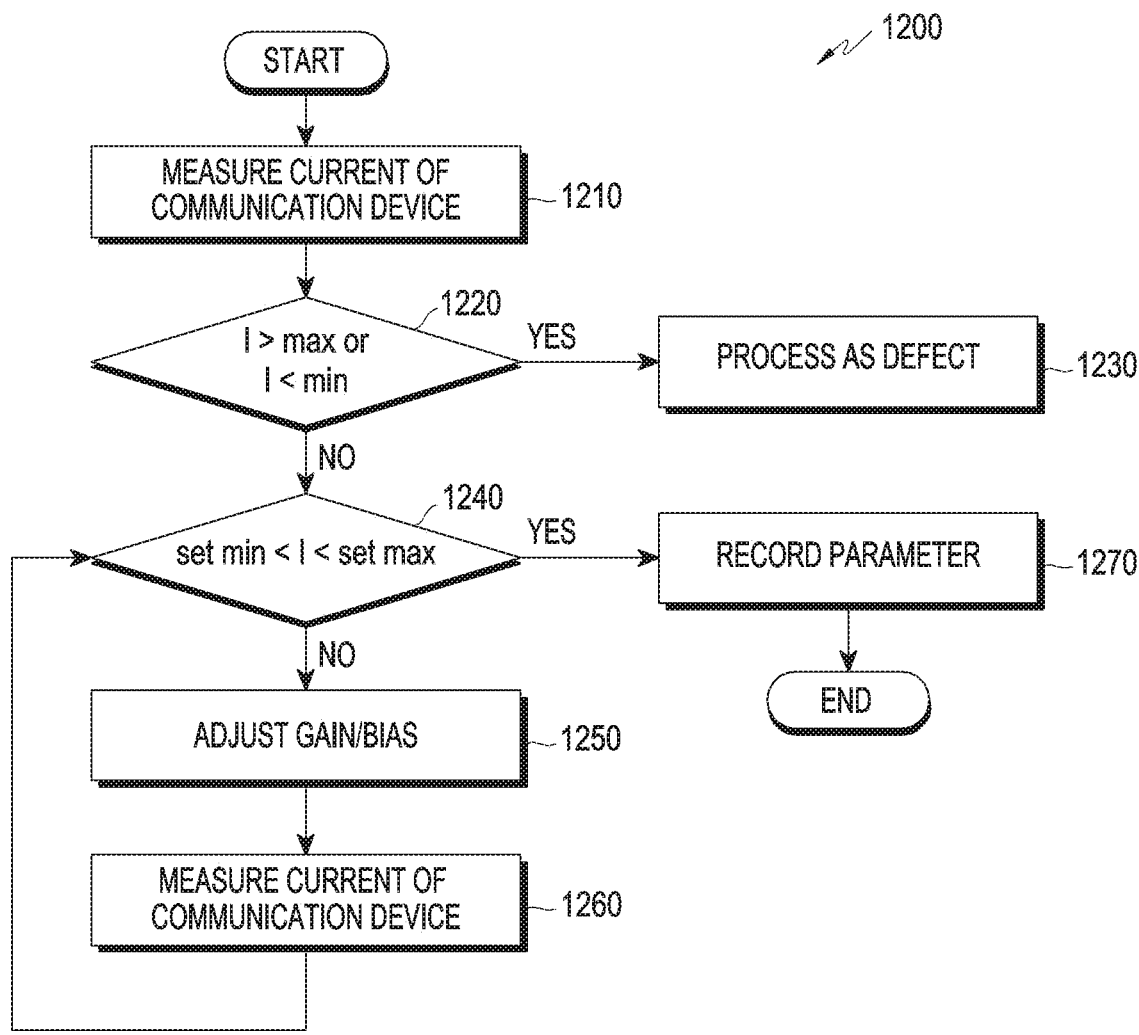
FIG. 12 is a flowchart of a calibration method in an electronic device, according to various embodiments of the present disclosure.

FIG. 12 is a flowchart of a calibration method in an electronic device, according to various embodiments of the present disclosure. To perform calibration, a measurement environment for the communication device (e.g., the communication device 731 of FIG. 7) shown in FIG. 7 or 8 may be set up. According to various embodiments, a maximum value (max) and a minimum value (min) of current for determining a defect of the communication device may be set. According to various embodiments, a minimum set value (set min) and a maximum set value (set max) for a target current range for performing calibration may be set.

In operation 1210, the electronic device may apply an RF signal or an IF signal to the communication device (e.g., the communication device 731 of FIG. 7) and measure power flowing in the communication device. According to various embodiments, measurement of the current may be performed from current consumed upon supply of the power to the communication device. When the measured current exceeds the set maximum value of current or is less than the set minimum value of current in operation 1220, the second communication circuit may be processed as a defect in operation 1230 because the second communication circuit is an unavailable communication circuit.

When the result of the measurement falls in a range between the maximum value and the minimum value, which is a current condition for normal decision of the communication device in operation 1220, an operation for calibration may be performed in operation 1240.

When the value measured as the result of the measurement does not satisfy a preset condition (e.g., the measured value falls beyond a reference range for calibration) in operation 1240, the electronic device may adjust a gain and/or a bias in operation 1250.

When the current flowing in the communication device is measured in operation 1260, the measured value may change with adjustment of the gain or the bias. When the changed measured value satisfies the preset condition (e.g., the measured value falls within a designated range) in operation 1240, a parameter corresponding to a gain and/or a bias in case of satisfaction with the preset condition may be stored in the memory of the communication device in operation 1270.

According to various embodiments of the present disclosure, when the electronic device including the communication device performs communication, the electronic device may control the current of the communication device by using a parameter stored as a result of performing calibration on the communication device.

Figure 13:
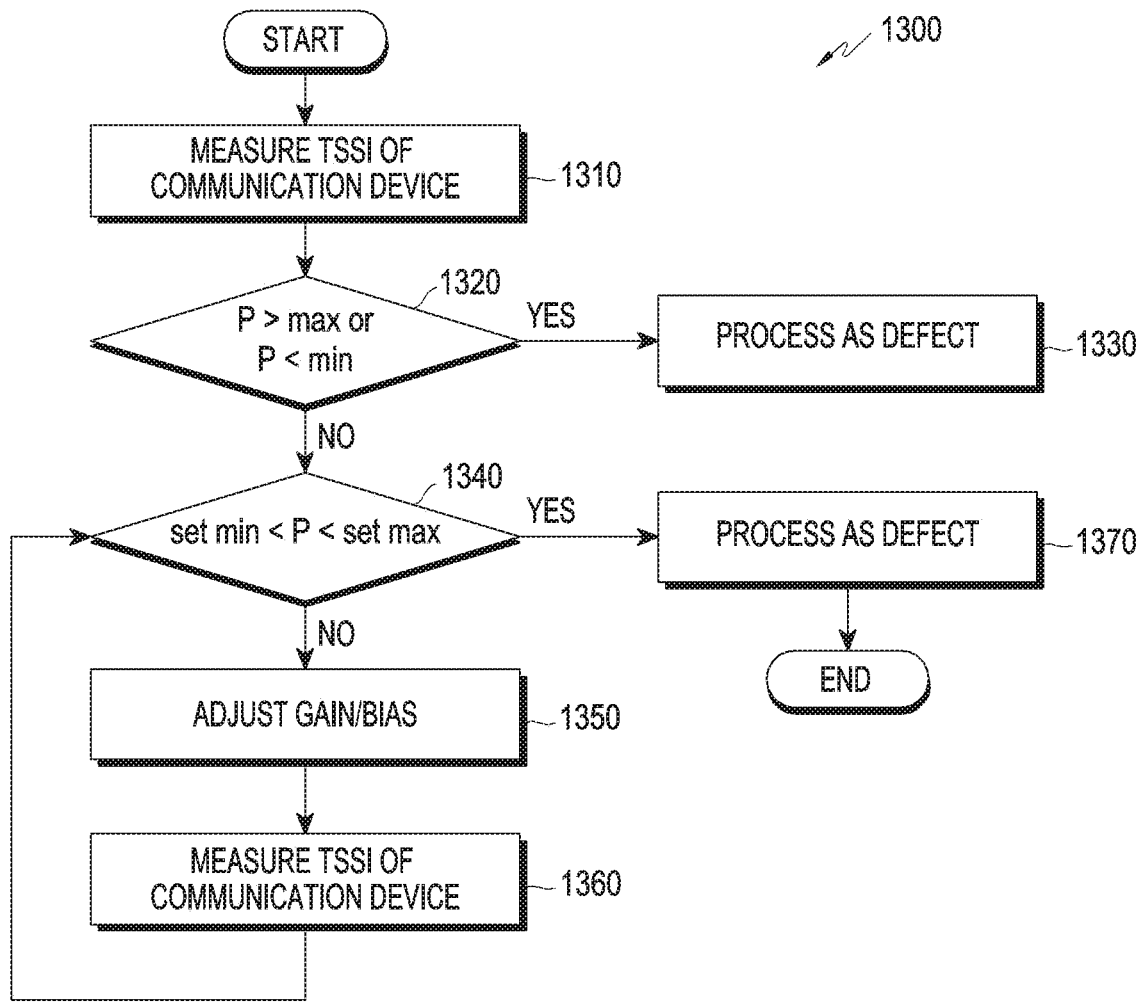
FIG. 13 is a flowchart of a calibration method in an electronic device, according to various embodiments of the present disclosure.

FIG. 13 is a flowchart of a calibration method in an electronic device, according to various embodiments of the present disclosure. To perform calibration, a measurement environment for the communication device (e.g., the communication device 731 of FIG. 7) shown in FIG. 7 or 8 may be set up. According to various embodiments, a maximum value (max) and a minimum value (min) of power for determining a defect of the communication device may be set. According to various embodiments, a minimum set value (P min) and a maximum set value (P max) for a target power range for performing calibration may be set.

In operation 1310, the electronic device may apply an RF signal or an IF signal to the communication device (e.g., the communication device 731 of FIG. 7) and determine an ADC value for a TSSI of a signal output from the communication device. According to various embodiments, measurement of the TSSI may be performed based on a TSSI (e.g., the TSSI 350 of FIG. 3) included in the PA (e.g., the PA 216 of FIG. 2) included in the communication device.

When the ADC value of the measured TSSI exceeds the set maximum value (max) or is less than the set minimum value (min) in operation 1320, the communication device may be processed as a defect in operation 1330 because the communication device is an unavailable communication device.

When the ADC value of the TSSI falls in a range between the maximum value and the minimum value, which is a current condition for normal decision of the communication device in operation 1320, an operation for calibration may be performed in operation 1340.

When the ADC value of the TSSI measured as the result of the measurement does not satisfy a preset condition (e.g., the measured value falls beyond a reference range for calibration) in operation 1340, the electronic device may adjust a gain and/or a bias in operation 1350.

When the ADC value of the TSSI flowing in the communication device is determined in operation 1360, the measured value may change with adjustment of the gain or the bias. When the changed measured value satisfies the preset condition (e.g., the measured value falls within a designated range (set min<P<set max)) in operation 1340, a parameter corresponding to a gain and/or a bias in case of satisfaction with the preset condition may be stored in the memory of the communication device in operation 1370.

According to various embodiments of the present disclosure, when the electronic device including the communication device performs communication, the electronic device may control the current of the communication device by using a parameter stored as a result of performing calibration on the communication device.

Figure 14:
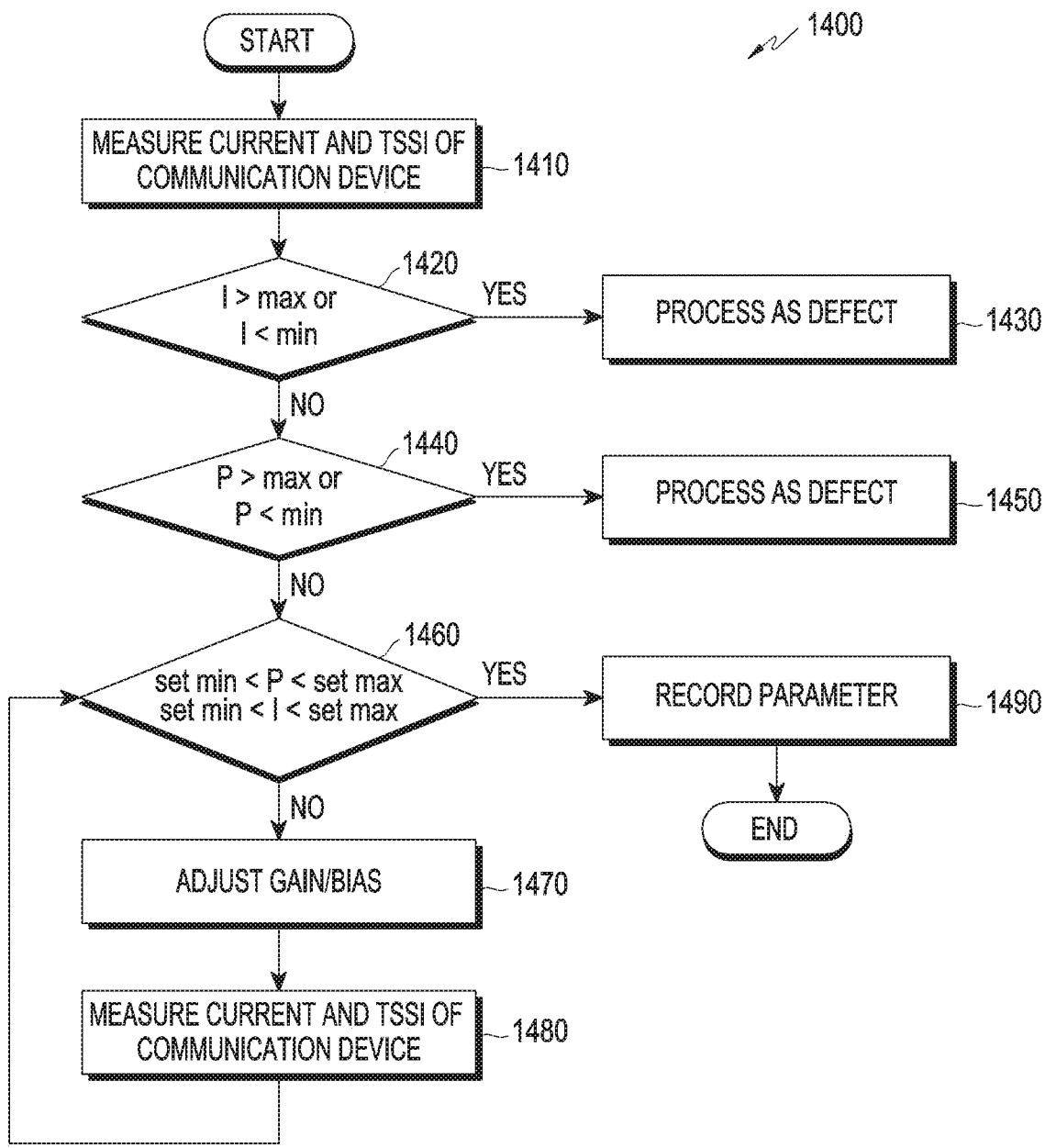
FIG. 14 is a flowchart of a calibration method in an electronic device, according to various embodiments of the present disclosure.

FIG. 14 is a flowchart of a calibration method in an electronic device, according to various embodiments of the present disclosure. According to various embodiments, to perform calibration, a measurement environment for the communication device (e.g., the communication device 731 of FIG. 7) shown in FIG. 7 or 8 may be set up. According to various embodiments, a maximum value (max) and a minimum value (min) of current and power for determining a defect of the communication device may be set respectively.

In operation 1410, the electronic device may apply an RF signal or an IF signal to the communication device (e.g., the communication device 731 of FIG. 7) and determine current of the communication device and an ADC value for a TSSI of a signal output from the communication device. According to various embodiments, measurement of the TSSI may be performed based on a TSSI (e.g., the TSSI 350 of FIG. 3) included in the PA (e.g., the PA 216 of FIG. 2) included in the communication device. According to various embodiments, measurement of the current may be performed by measuring current consumed upon supply of the power to the communication device.

When the measured current exceeds the set maximum value of current or is less than the set minimum value of current in operation 1420, the second communication circuit may be processed as a defect in operation 1430 because the second communication circuit is an unavailable communication circuit.

When the result of the measurement falls in a range between the maximum value and the minimum value, which is a current condition for normal decision of the communication device in operation 1420, it may be determined whether power of the communication device satisfies the condition for normal decision.

When the ADC value of the measured TSSI exceeds the set maximum value (max) or is less than the set minimum value (min) in operation 1440, the communication device may be processed as a defect in operation 1450 because the communication device is an unavailable communication device.

When the ADC value of the TSSI falls in a range between the maximum value and the minimum value, which is a current condition for normal decision of the communication device in operation 1440, an operation for calibration may be performed in operation 1460. Operations 1420 and 1440 may be processed in an order shown in FIG. 14, and operation 1440 may be performed first and then operation 1420 may be performed according to various embodiments.

When the ADC value of the TSSI measured as the result of the measurement does not satisfy a preset condition (e.g., the measured value falls beyond a reference range for calibration) and/or the measured current does not satisfy a preset condition in operation 1460, the electronic device may adjust a gain and/or a bias in operation 1470.

When the ADC value of the TSSI or current flowing in the communication device is determined in operation 1480, the measured value may change with adjustment of the gain or the bias. When the changed measured value satisfies the preset condition (e.g., the measured value falls within a designated range (set min<P<set max and/or set min<I<set max)) in operation 1460, a parameter corresponding to a gain and/or a bias in case of satisfaction with the preset condition may be stored in the memory of the communication device in operation 1490.

According to various embodiments of the present disclosure, when the electronic device including the communication device performs communication, the electronic device may control the current of the communication device by using a parameter stored as a result of performing calibration on the communication device.

Figure 15:
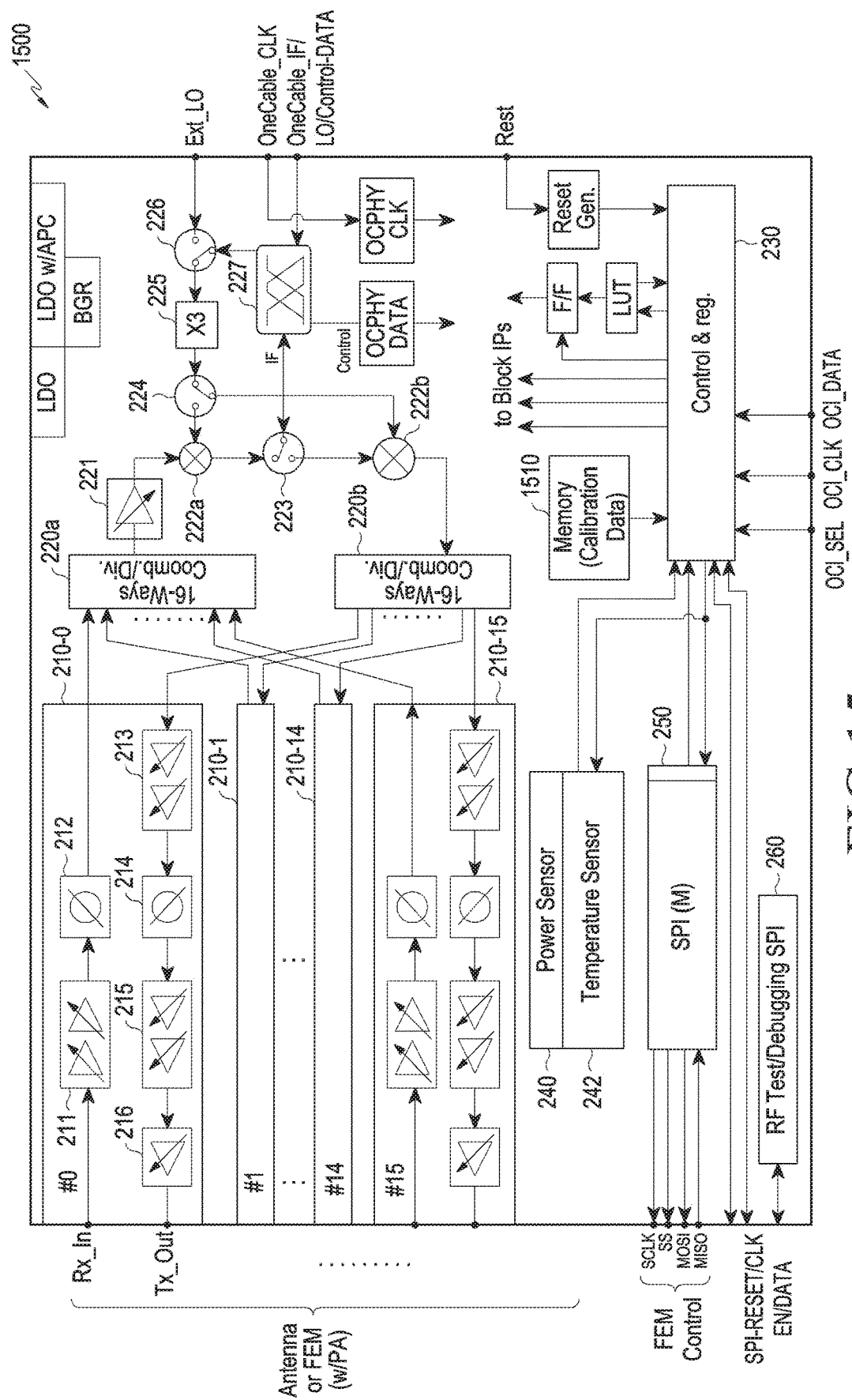
FIG. 15 is a circuit diagram illustrating a structure of a second communication circuit, according to various embodiments of the present disclosure.

FIG. 15 is a circuit diagram illustrating a structure of a second communication circuit, according to various embodiments of the present disclosure. The second communication circuit 1500 of FIG. 15 may further include a memory 1510 in addition to the above-described components of the second communication circuit 200 of FIG. 2, and data corresponding to a result of calibration may be stored in the memory 1510. According to various embodiments, reference numerals that are the same as those of the blocks shown in FIG. 2 may perform the same functions and thus will not be described in detail. According to various embodiments, calibration data may be stored using any one of a memory configured in the second communication circuit 200 of FIG. 2 without addition of the memory 1510 in FIG. 15.

According to various embodiments of the present disclosure, for calibration using current or calibration using power level sensing as described above, the memory 1510 capable of storing the calibration data may be added inside the second communication circuit shown in FIG. 2.

According to various embodiments, the memory 1510 included in the shown second communication circuit 1500 may also operate when the second communication circuit 1500 operates in a test mode for calibration. For example, when the second communication circuit 1500 operates in the test mode, the transition switch 226 may switch to the test mode.

According to various embodiments, in the second communication circuit 1500, in the test mode, a test signal Ext_Lo may be input to the transition switch 226 and the test signal input to the transition switch 226 may be provided to the transmission/reception signal processing circuit 210.

According to various embodiments, the controller 230 may adjust a gain and/or a bias of each amplifier included in the transmission/reception signal processing circuit 210 in the test mode. According to various embodiments, a parameter for adjusting the gain and/or the bias of each amplifier may be stored in the memory 1510.

According to various embodiments, after a calibration procedure is completed and the parameter is stored in the memory 1510, the second communication circuit 1500 may be mounted in the electronic device to communicate with a first communication circuit (e.g., the first communication circuit 113 of FIG. 1). Once the electronic device performs communication through the first communication circuit 113, the processor (e.g., the processor 111 of FIG. 1) or the communication module (e.g., the communication module 112 of FIG. 1) according to various embodiments may adjust a gain and/or a bias of at least one amplifier included in the second communication circuit 1500 based on the parameter stored in the memory 1510 of the second communication circuit 1500.

According to various embodiments, the processor (e.g., the processor 111 of FIG. 1) or the communication module (e.g., the communication module 112 of FIG. 1) may read the parameter stored in the memory 1510 of the second communication circuit 1500 and store the read parameter in a memory arranged in a PCB (e.g., the PCB 110 of FIG. 1). Once the electronic device performs communication through the first communication circuit (e.g., the first communication circuit 113 of FIG. 1), the processor (e.g., the processor 111 of FIG. 1) or the communication module (e.g., the communication module 112 of FIG. 1) according to various embodiments may adjust a gain and/or a bias of at least one amplifier included in the second communication circuit 1500 based on the parameter stored in the memory of the PCB 110.

Figure 16:
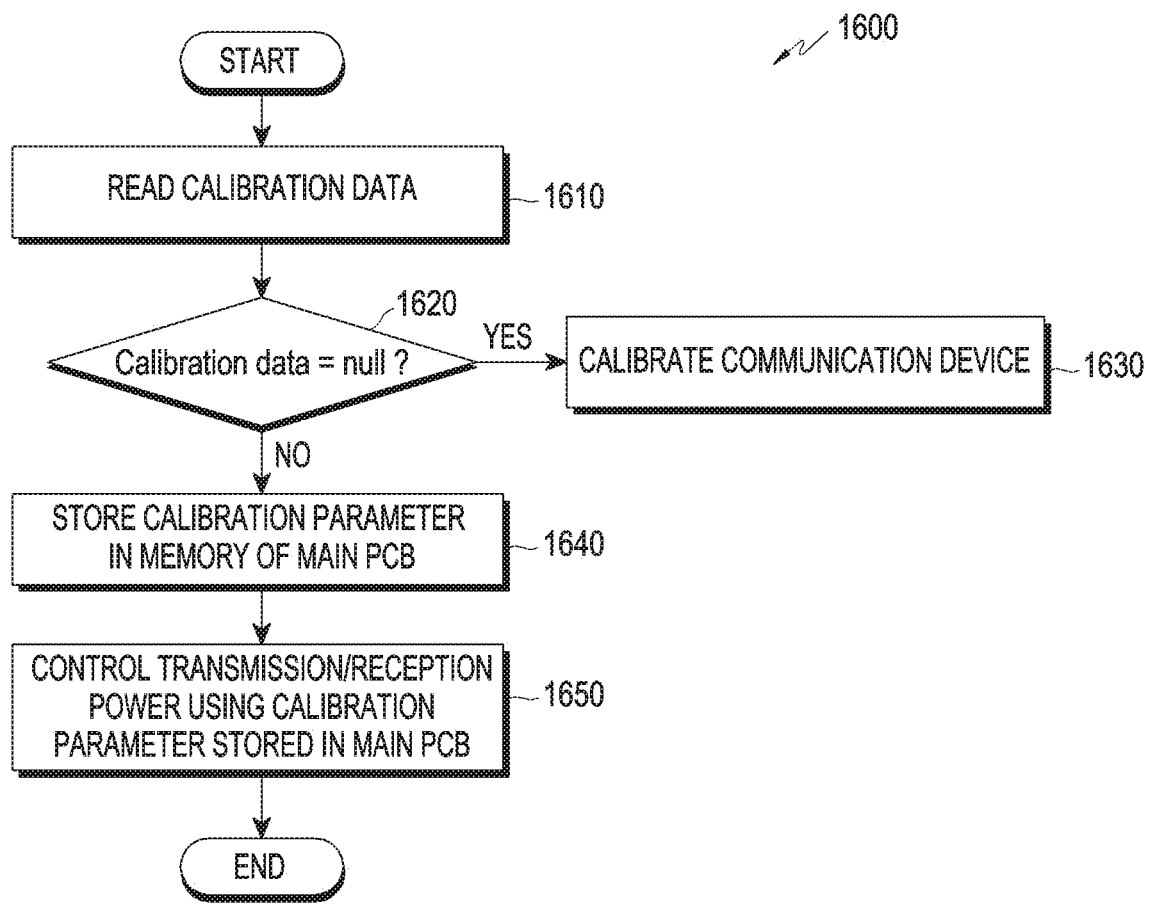
FIG. 16 is a flowchart showing operations of an electronic device, according to various embodiments of the present disclosure.

FIG. 16 is a flowchart showing operations of an electronic device, according to various embodiments of the present disclosure. Referring to FIG. 16, a communication device on which calibration has been completed may be mounted on an electronic device.

In operation 1610, the electronic device may read a region of a memory (e.g., the memory 1510 of FIG. 15) of the second communication circuit (e.g., the second communication circuit 200 of FIG. 2).

When calibration data read through the memory is null in operation 1620, a calibration correction procedure of a second communication circuit may be performed in operation 1630.

When the calibration data read through the memory is not null in operation 1620, a calibration parameter stored in the memory of the second communication circuit may be stored in a memory of a PCB (e.g., a main PCB) in operation 1640. According to various embodiments, operation 1640 may be omitted.

In operation 1650, when the electronic device transmits and receives an RF signal through the second communication circuit, the electronic device may control the second communication circuit by using the calibration parameter stored in the memory of the PCB.

According to various embodiments of the present disclosure, a communication module (e.g., the communication module 112 of FIG. 1) of an electronic device may collect a parameter stored in a calibration data memory region of a second communication circuit and use the parameter in transmission or reception without changing a storage position of the parameter, or store the collected parameter in a memory region of a main PCB (e.g., the PCB 110 of FIG. 1) and use the parameter in transmission or reception.

According to various embodiments of the present disclosure, an operation method of an electronic device includes generating, by a first communication circuit, a signal in a radio frequency (RF) band (RF signal) or a signal in an intermediate frequency (IF) band (IF signal), transmitting the RF signal or IF signal, generated by the first communication circuit, to a second communication circuit, transmitting a control signal, generated based on at least one parameter set corresponding to characteristics of the second communication circuit, to the second communication circuit, receiving, by the second communication circuit, the control signal and controlling at least one amplifier included in the second communication circuit based on the received control signal, and transmitting, by the second communication circuit, a signal amplified by the at least one amplifier to at least one array antenna.

According to various embodiments of the present disclosure, the control signal may include a signal for controlling a gain and/or a bias of the at least one amplifier included in the second communication circuit.

According to various embodiments of the present disclosure, the electronic device may further include a communication device arranged inside the housing, in which the communication device may include the at least one array antenna and the second communication circuit.

According to various embodiments of the present disclosure, the at least one parameter may be uniquely set corresponding to the second communication circuit.

According to various embodiments of the present disclosure, the second communication circuit may include at least one of a phase shifter drive amplifier (PSDA), a phase shifter (PS), a pre-power amplifier (PPA), or a power amplifier (PA).

According to various embodiments of the present disclosure, the control signal may include a signal for controlling a gain and/or a bias of at least one of the PSDA, the PPA, or the PA.

According to various embodiments of the present disclosure, the control signal may include a signal for controlling a gain and/or a bias of at least one amplifier included in the PSDA, a gain and/or a bias of at least one amplifier included in the PPA, or a gain and/or a bias of at least one amplifier included in the PA.

According to various embodiments of the present disclosure, the electronic device may further include a printed circuit board (PCB) arranged inside the housing, in which the first communication circuit may be included in the PCB.

According to various embodiments of the present disclosure, the electronic device may further include a first memory included in the second communication circuit and a second memory arranged on the PCB, in which the operation method may further include transmitting the at least one parameter stored in the first memory to the second memory.

According to various embodiments of the present disclosure, the IF signal may correspond to a frequency between 8 GHz and 12 GHz and the RF signal may correspond to a frequency between 25 GHz to 60 GHz.

Hereinbelow, according to various embodiments of the present disclosure, experimental examples corresponding to a result of calibration will be described. In the following experimental examples, calibration using current has been performed on twenty 5G mmWave RF modules. Current for defect decision has been set to 100 mA as a minimum value (min) and 400 mA as a maximum value (max).

As a result of experiment, none of the twenty modules is a defective module, and current measurement for calibration has been performed in the next step. A current target set value for the calibration has been set to 240 mA as set min and 260 mA as set max.

Until current measured for the 5G mmWave second communication circuit of each of the twenty samples falls within a preset current target set value range, a parameter for adjusting a gain and a bias of a PPA and a PSDA inside the second communication circuit has been changed. The changed parameter has been stored in the calibration data memory region in the second communication circuit. A change in the current of the twenty 5G mmWave RF modules experimented in the foregoing experimental order has shown results of Table 2 provided below.

TABLE 2

| Sample No. | Current (A) | |
|---|---|---|
| | Before Calibration | After Calibration |
| 1 | 0.22 | 0.25 |
| 2 | 0.219 | 0.249 |
| 3 | 0.235 | 0.245 |
| 4 | 0.28 | 0.25 |
| 5 | 0.259 | 0.249 |
| 6 | 0.246 | 0.246 |
| 7 | 0.316 | 0.246 |
| 8 | 0.288 | 0.248 |
| 9 | 0.228 | 0.248 |
| 10 | 0.24 | 0.25 |
| 11 | 0.239 | 0.249 |
| 12 | 0.286 | 0.246 |
| 13 | 0.24 | 0.25 |
| 14 | 0.274 | 0.254 |
| 15 | 0.236 | 0.256 |
| 16 | 0.208 | 0.258 |
| 17 | 0.226 | 0.256 |
| 18 | 0.203 | 0.253 |
| 19 | 0.23 | 0.25 |
| 20 | 0.232 | 0.252 |

Table 3 provided below is a table showing a result of measuring an EIRP after calibration in Table 2.

TABLE 3

| Sample No. | Before Calibration | | After Calibration | |
|---|---|---|---|---|
| | Current (A) | EIRP(dBm) | Current (A) | EIRP(dBm) |
| 1 | 0.22 | 23.99 | 0.25 | 25.19 |
| 2 | 0.219 | 23.87 | 0.249 | 25.10 |
| 3 | 0.235 | 25.60 | 0.245 | 25.91 |
| 4 | 0.28 | 28.26 | 0.25 | 26.11 |
| 5 | 0.259 | 26.44 | 0.249 | 26.17 |
| 6 | 0.246 | 25.71 | 0.246 | 25.71 |
| 7 | 0.316 | 29.14 | 0.246 | 26.09 |
| 8 | 0.288 | 27.98 | 0.248 | 26.01 |
| 9 | 0.228 | 24.03 | 0.248 | 24.86 |
| 10 | 0.24 | 25.97 | 0.25 | 26.25 |
| 11 | 0.239 | 25.87 | 0.249 | 26.16 |
| 12 | 0.286 | 28.57 | 0.246 | 25.98 |
| 13 | 0.24 | 25.94 | 0.25 | 26.22 |

TABLE 3-continued

| | Before Calibration | | After Calibration | |
|---|---|---|---|---|
| Sample No. | Current (A) | EIRP(dBm) | Current (A) | EIRP(dBm) |
| 14 | 0.274 | 27.91 | 0.254 | 25.83 |
| 15 | 0.236 | 25.84 | 0.256 | 26.41 |
| 16 | 0.208 | 22.58 | 0.258 | 24.98 |
| 17 | 0.226 | 24.13 | 0.256 | 25.30 |
| 18 | 0.203 | 22.90 | 0.253 | 25.16 |
| 19 | 0.23 | 24.12 | 0.25 | 24.94 |
| 20 | 0.232 | 24.60 | 0.252 | 25.33 |
| Average | 0.24525 | 25.6716 | 0.25025 | 25.6858 |
| Minimum Value | 0.203 | 22.582 | 0.245 | 24.861 |
| Maximum Value | 0.316 | 29.139 | 0.258 | 26.406 |

Figure 17:
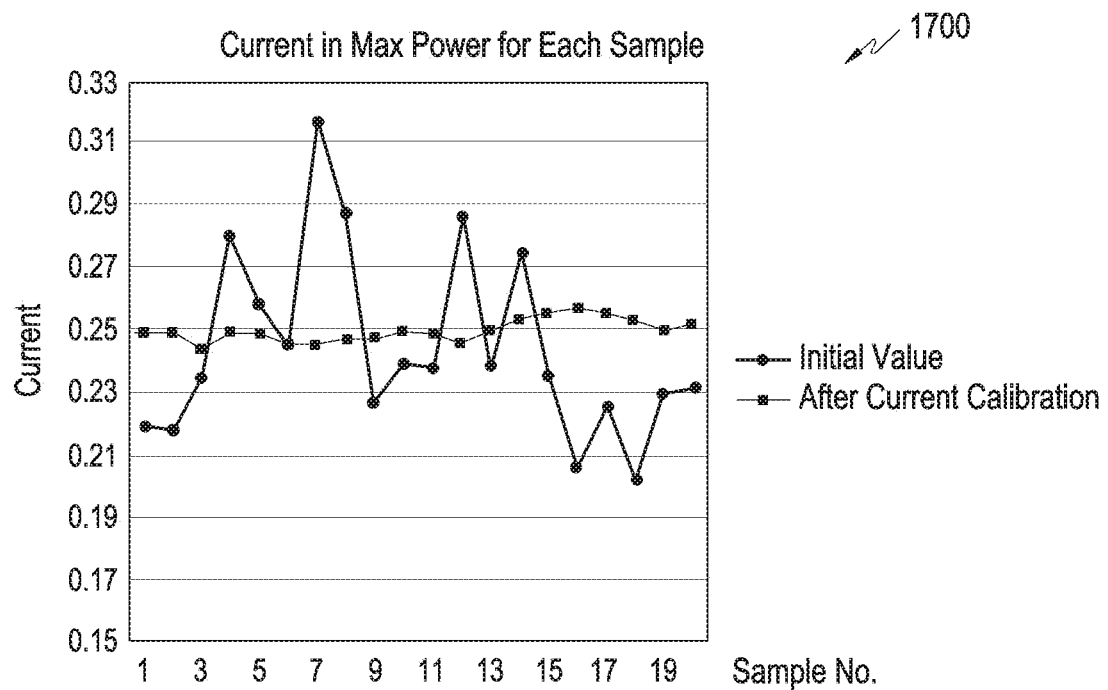
FIG. 17 is a graph showing current calibrated in maximum power for each sample, according to various embodiments of the present disclosure.
Figure 18:
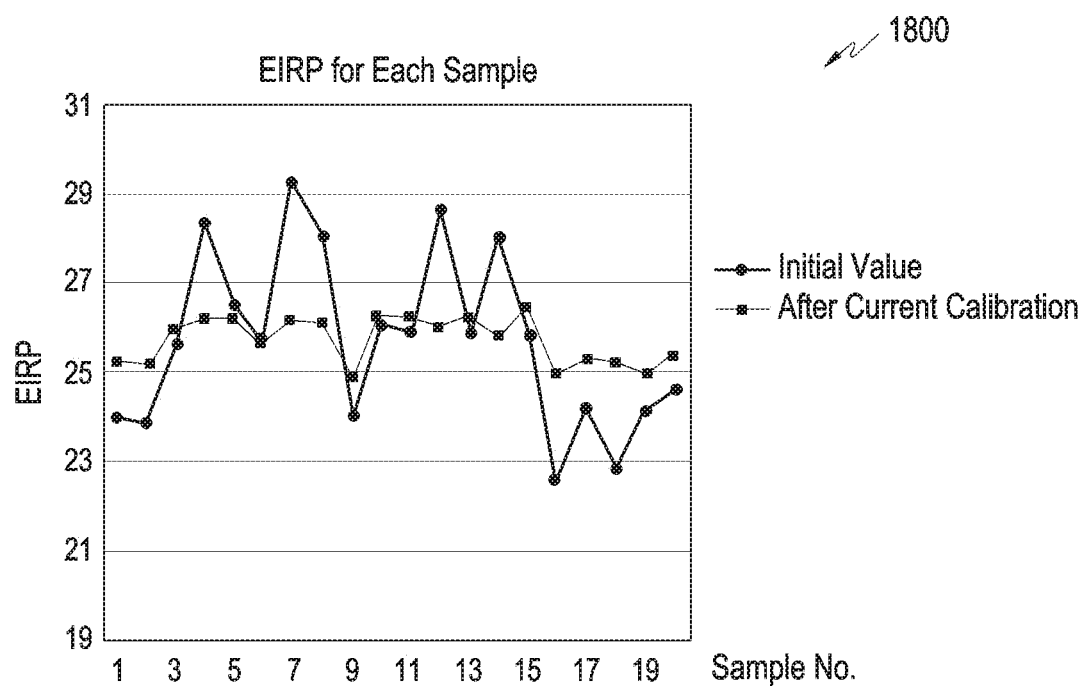
FIG. 18 is a graph showing an EIRP calibrated for each sample, according to various embodiments of the present disclosure.

Results of Table 3 may be expressed as graphs shown in FIGS. 17 and 18.

FIG. 17 is a graph 1700 showing calibrated current in maximum power for each sample according to various embodiments of the present disclosure, and FIG. 18 is a graph 1800 showing a calibrated EIRP for each sample according to various embodiments of the present disclosure.

Referring to Table 3 and FIGS. 17 and 18, an EIRP result after calibration with respect to the communication device or the second communication circuit using current shows that a deviation between samples is adjusted from 6 dBm or more to 2 dBm or less when compared to a result before the calibration. For example, an EIRP has a difference of 6.5 dBm or more before calibration, but is reduced to 1.6 dBm or less after calibration.

Figure 19:
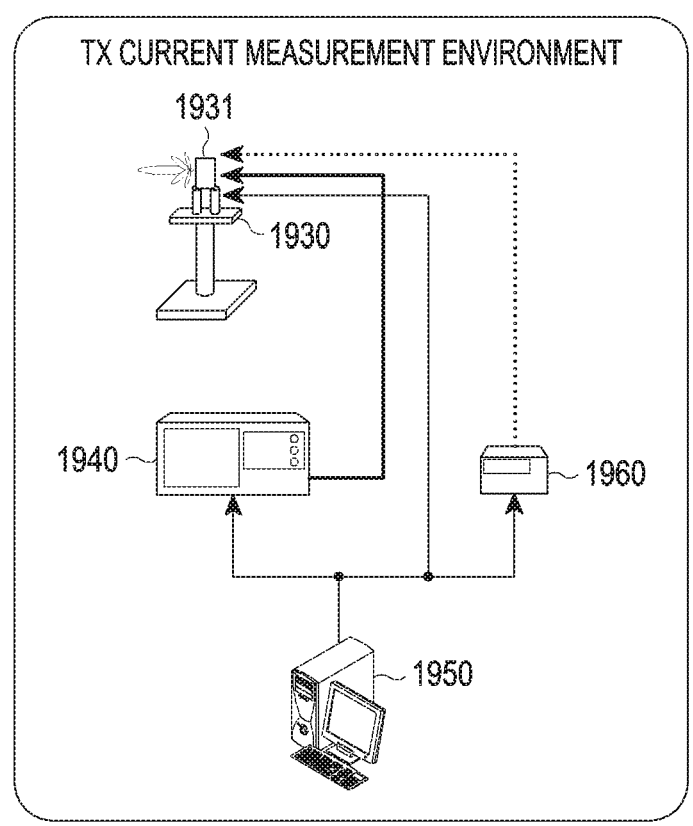
FIG. 19 illustrates a TX measurement environment for calibration, according to various embodiments of the present disclosure.

FIG. 19 illustrates a TX measurement environment for calibration, according to various embodiments of the present disclosure. Referring to FIG. 19, according to various embodiments of the present disclosure, calibration may be performed without installation of the above-described equipment shown in FIGS. 7 and 8.

Referring to FIG. 19, in the TX measurement environment, a control signal generated through a PC 1950 may be transmitted to a signal generator 1940 that may generate a corresponding RF signal or IF signal based on the control signal transmitted from the PC 1950. The RF signal or IF signal generated by the signal generator 1940 may be provided to a communication device 1931 (e.g., the communication device 731 of FIG. 7 or the second communication circuit 1500 of FIG. 15) placed on a cradle 1930. The communication device 1931 may include at least one array antenna (e.g., the array antenna 122 of FIG. 1) and may be provided with the RF signal or the IF signal from the signal generator 1940 and transmit the RF signal or IF signal over the air (OTA) through the array antenna 121.

According to an embodiment of the present disclosure, when the communication device 1931 transmits the RF signal, current of the communication device 1931 may be measured. For example, a power supply 1960 may supply power to the communication device 1931, and when the power is supplied to the communication device 1931, current flowing in the communication device 1931 through a supply line may be measured. According to various embodiments, by measuring the power of the communication device 1931 through an ADC value of a TSSI (e.g., the TSSI 350 of FIG. 3) included in an output terminal of a PA (e.g., the PA 216 of FIG. 2) included in the communication device 1931, calibration may be performed.

According to various embodiments, as described above, for TSSI, the calibration experiment has been performed on the twenty samples. In the following experimental examples, calibration using current has been performed on twenty 5G mmWave RF modules. Current for defect decision has been set to 100 mA as a minimum value (min) and 400 mA as a maximum value (max). An ADC value of the TSSI has been set to Pmin=22 and Pmax=8C.

As a result of experiment, none of the twenty modules is a defective module, and current measurement for calibration has been performed in the next step. A TSSI target set value for the calibration has been set to set min=48 and set max=4D.

Until TSSI measured for the 5G mmWave second communication circuit of each of the twenty samples falls within a preset TSSI target set value range, a parameter for adjusting a gain and a bias of a PPA and a PSDA inside the second communication circuit has been changed. The changed parameter has been stored in the calibration data memory region in the second communication circuit. A change in the TSSI of the twenty 5G mmWave RF modules experimented in the foregoing experimental order has shown results of Table 2 through Table 6 provided below.

TABLE 4

| | Initial Value | |
|---|---|---|
| Sample No. | ACD Code | EIRP(dBm) |
| 1 | 34 | 23.96 |
| 2 | 35 | 23.81 |
| 3 | 46 | 25.49 |
| 4 | 5A | 28.11 |
| 5 | 4E | 26.53 |
| 6 | 4A | 25.64 |
| 7 | 60 | 29.01 |
| 8 | 58 | 27.96 |
| 9 | 35 | 24.12 |
| 10 | 4B | 25.97 |
| 11 | 49 | 25.81 |
| 12 | 59 | 28.61 |
| 13 | 4A | 25.88 |
| 14 | 54 | 27.86 |
| 15 | 4B | 25.95 |
| 16 | 2A | 22.61 |
| 17 | 38 | 24.31 |
| 18 | 2E | 22.78 |
| 19 | 3A | 24.02 |
| 20 | 41 | 24.85 |
| Average (avg) | | 25.66 |
| Minimum Value (min) | | 22.61 |
| Maximum Value (max) | | 29.01 |

TABLE 5

| | ACD Code | |
|---|---|---|
| Sample No. | Before Calibration | After Calibration |
| 1 | 34 | 48 |
| 2 | 35 | 49 |
| 3 | 46 | 4C |
| 4 | 5A | 4D |
| 5 | 4E | 4A |
| 6 | 4A | 49 |
| 7 | 60 | 4A |
| 8 | 58 | 4C |
| 9 | 35 | 48 |
| 10 | 4B | 4B |
| 11 | 49 | 49 |
| 12 | 59 | 4A |
| 13 | 4A | 4A |
| 14 | 54 | 48 |

TABLE 5-continued

| | ACD Code | |
|---|---|---|
| Sample No. | Before Calibration | After Calibration |
| 15 | 4B | 4B |
| 16 | 2A | 49 |
| 17 | 38 | 49 |
| 18 | 2E | 4A |
| 19 | 3A | 49 |
| 20 | 41 | 49 |

TABLE 6

| | Before Calibration | | After Calibration | |
|---|---|---|---|---|
| Sample No. | ACD Code | EIRP(dBm) | ACD Code | EIRP(dBm) |
| 1 | 34 | 23.96 | 48 | 26.01 |
| 2 | 35 | 23.81 | 49 | 25.61 |
| 3 | 46 | 25.49 | 4C | 25.91 |
| 4 | 5A | 28.11 | 4D | 26.34 |
| 5 | 4E | 26.53 | 4A | 25.92 |
| 6 | 4A | 25.64 | 49 | 25.81 |
| 7 | 60 | 29.01 | 4A | 26.00 |
| 8 | 58 | 27.96 | 4C | 26.35 |
| 9 | 35 | 24.12 | 48 | 25.14 |
| 10 | 4B | 25.97 | 4B | 26.33 |
| 11 | 49 | 25.81 | 49 | 25.74 |
| 12 | 59 | 28.61 | 4A | 25.98 |
| 13 | 4A | 25.88 | 4A | 26.15 |
| 14 | 54 | 27.86 | 48 | 25.74 |
| 15 | 4B | 25.95 | 4B | 26.19 |
| 16 | 2A | 22.61 | 49 | 24.85 |
| 17 | 38 | 24.31 | 49 | 25.75 |
| 18 | 2E | 22.78 | 4A | 25.67 |
| 19 | 3A | 24.02 | 49 | 24.94 |
| 20 | 41 | 24.85 | 49 | 25.26 |
| Average | | 25.66 | | 25.78 |
| Minimum Value | | 22.61 | | 24.85 |
| Maximum Value | | 29.01 | | 26.35 |

Figure 20:
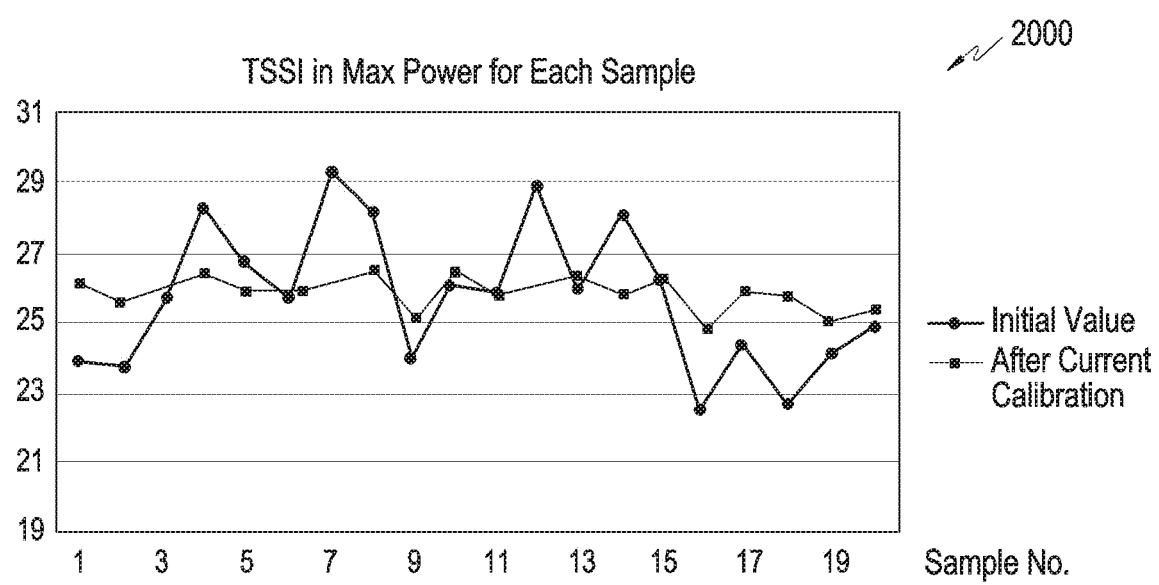
FIG. 20 is a graph showing TSSI calibrated in maximum power for each sample, according to various embodiments of the present disclosure.

The results may be expressed as a graph shown in FIG. 20. FIG. 20 is a graph 2000 showing TSSI calibrated in maximum power for each sample, according to various embodiments of the present disclosure.

Referring to Table 6 and FIG. 20, an EIRP result after calibration with respect to the communication device using TSSI shows that a deviation between samples is adjusted from 6 dBm or more to 2 dBm or less when compared to a result before the calibration. For example, an EIRP has a difference of 6.4 dBm or more before calibration, but is reduced to 1.5 dBm or less after calibration.

Figure 21:
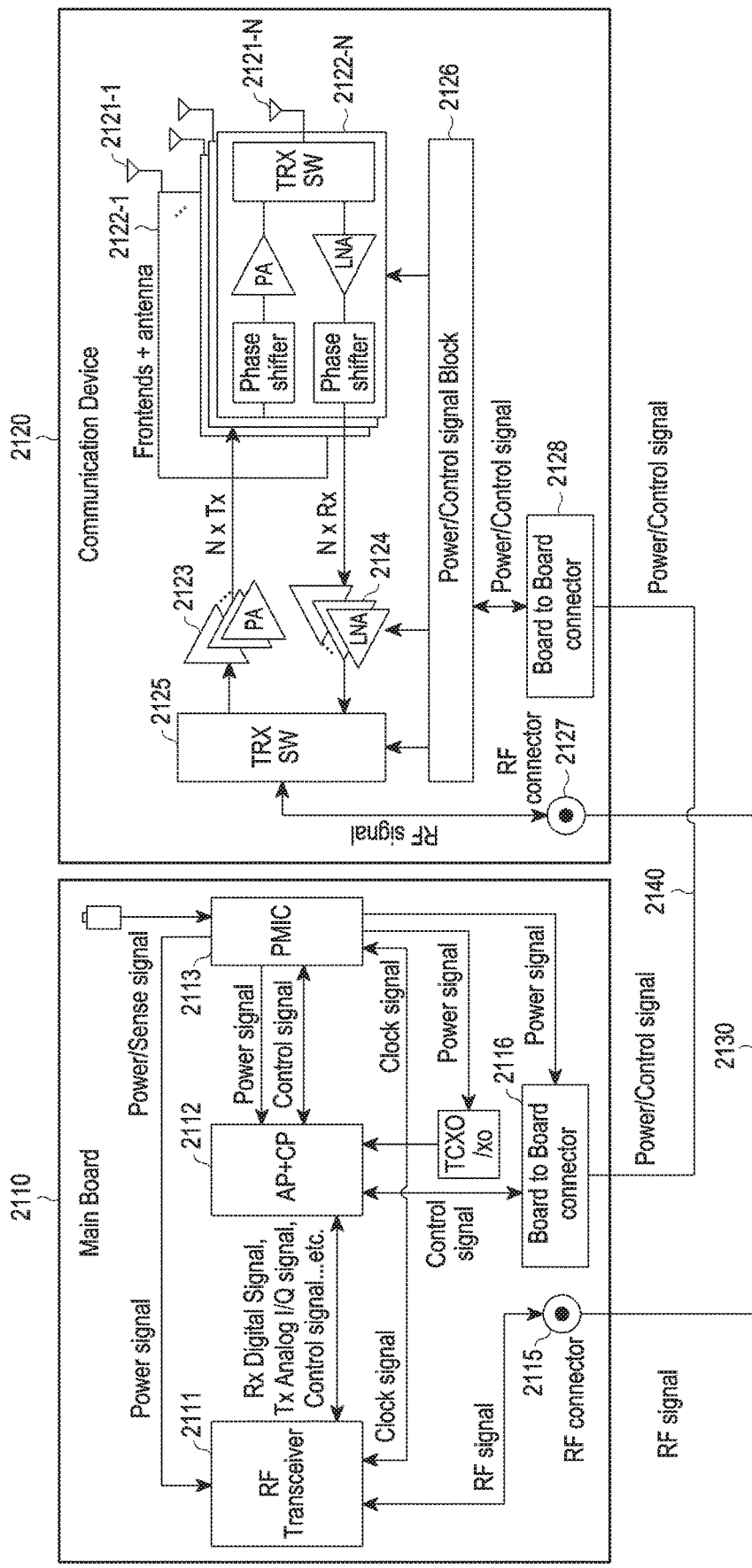
FIG. 21 illustrates a structure of an electronic device according to various embodiments of the present disclosure.

FIG. 21 illustrates a structure of an electronic device according to various embodiments of the present disclosure. Referring to FIG. 21, an electronic device according to various embodiments of the present disclosure may include a main board 2110 (e.g., a main PCB (e.g., the PCB 110 of FIG. 1)) or a communication device 2120 (e.g., the communication device 120 of FIG. 1 or the communication device 731 of FIG. 7).

According to various embodiments, the main board 110 may include at least one of a first communication circuit (e.g., an RF transceiver) 2111, a processor (e.g., an AP or a CP) 2112, a power management IC (PMIC) 2113, an RF connector 2115, or a board connector 2116.

According to various embodiments, the processor 2112 may be formed in a single chip or a plurality of chips. For example, the processor 2112 may include a communication module (CP) (e.g., the communication module 112 of FIG. 1) and an AP (e.g., the processor 111 of FIG. 1). The processor 2112 may transmit and receive a control signal for power control to and from the PMIC 2113 and be provided with power from the PMIC 2113.

According to various embodiments, the PMIC 2113 may be provided with power from a battery or a charger or from an external device through a power cable and supply power to each module or component included in the electronic device. For example, the PMIC 2113 may provide power to the processor 2112, the first communication circuit 2111, or a temperature controlled crystal oscillator/crystal oscillator (TCXO/XO). According to various embodiments, the PMIC 2113 may supply power to the communication device 2120 through the board connector 2116.

The processor 2112 may generate a signal to be transmitted through wireless communication as an analog I/Q signal and transmit the signal to the first communication circuit 2111. The first communication circuit 2111 may receive the analog I/Q signal from the processor 2112 and modulate the analog I/Q signal into an RF signal through a modulator. The first communication circuit 2111 may transmit the RF signal modulated by the modulator to the communication device 2120 through the RF connector 2115. The processor 2112 may transmit a control signal to the first communication circuit 2111 to control the first communication circuit 2111.

The main board 2110 and the communication device 2120 may be connected through at least one cable. For example, the RF connector 2115 of the main board 2110 may be connected with an RF connector 2127 of the communication device 2120 through a first cable 2130, and the board connector 2116 of the main board 2110 may be connected with a board connector 2128 of the communication device 2120 through a second cable 2140. According to various embodiments, the main board 2110 may transmit and receive the RF signal to and from the communication device 2120 through the first connector 2130. According to various embodiments, the main board 2110 may transmit a control signal and/or power to the communication device 2120 through the second connector 2140.

The communication device 2120 may include at least one of a plurality of antenna elements 2121 (or array antennas), a plurality of front-end circuits 2122 connected corresponding to the plurality of antenna elements, a PA 2123, an LNA 2124, a transmission/reception switch 2125, or a controller 2126.

The communication device 2120 may receive an RF signal transmitted from the main board 2110 through the RF connector 2127 and transmit the received RF signal to a transmission line through the transmission/reception switch 2125. For example, the transmission/reception switch 2125 may switch to a transmission mode to transmit the received RF signal to the PA 2123. The PA 2123 may amplify the received RF signal and transmit the amplified RF signal to the plurality of front-end circuits 2122. Each front-end circuit 2122 may perform wireless signal processing through a PS, a PA, a transmission/reception switch, etc., included in the front-end circuit 2122, and then transmit the RF signal to each antenna element 2121. Each antenna element 2121 may transmit the RF signal wireless-signal-processed in each front-end circuit 2122 to a radio space.

When the communication device 2120 operates in a reception mode, the RF signal received through each antenna element 2121 may be transmitted to the front-end circuit 2122 connected to each antenna element 2121. Each front-end circuit 2122 may receive the RF signal from the antenna element 2121, perform wireless signal processing through a transmission/reception switch, an LNA, a PS etc., included in the front-end circuit 2122, and then transmit the RF signal to the LNA 2124. The LNA 2124 may amplify the received RF signal and low-noise amplify the RF signal for total system noise performance optimization. The LNA 2124 may transmit the RF signal to the main board 2110 through the RF connector 2127 via the transmission/reception switch 2125.

The controller 2126 of the communication device 2120 may be provided with a control signal and power from the main board 2110 through the board connector 2128 and provide the control signal and the power to each component or circuit of the communication device 2120 or perform control.

According to various embodiments, the controller 2126 may output the control signal to control at least one of the transmission/reception switch 2125, the PA 2123, the LNA 2124, or the front-end circuit 2122.

According to various embodiments of the present disclosure, the controller 2126 may generate a control signal based on a parameter set through calibration with respect to each communication device 2120. According to various embodiments, the controller 2126 may transmit the control signal to at least one amplifier included in the front-end circuit 2122 and control a gain and/or a bias of the at least one amplifier. According to various embodiments, the set parameter may be stored in a memory of the main board 2110 or in a memory of the communication device 2120.

Figure 22:
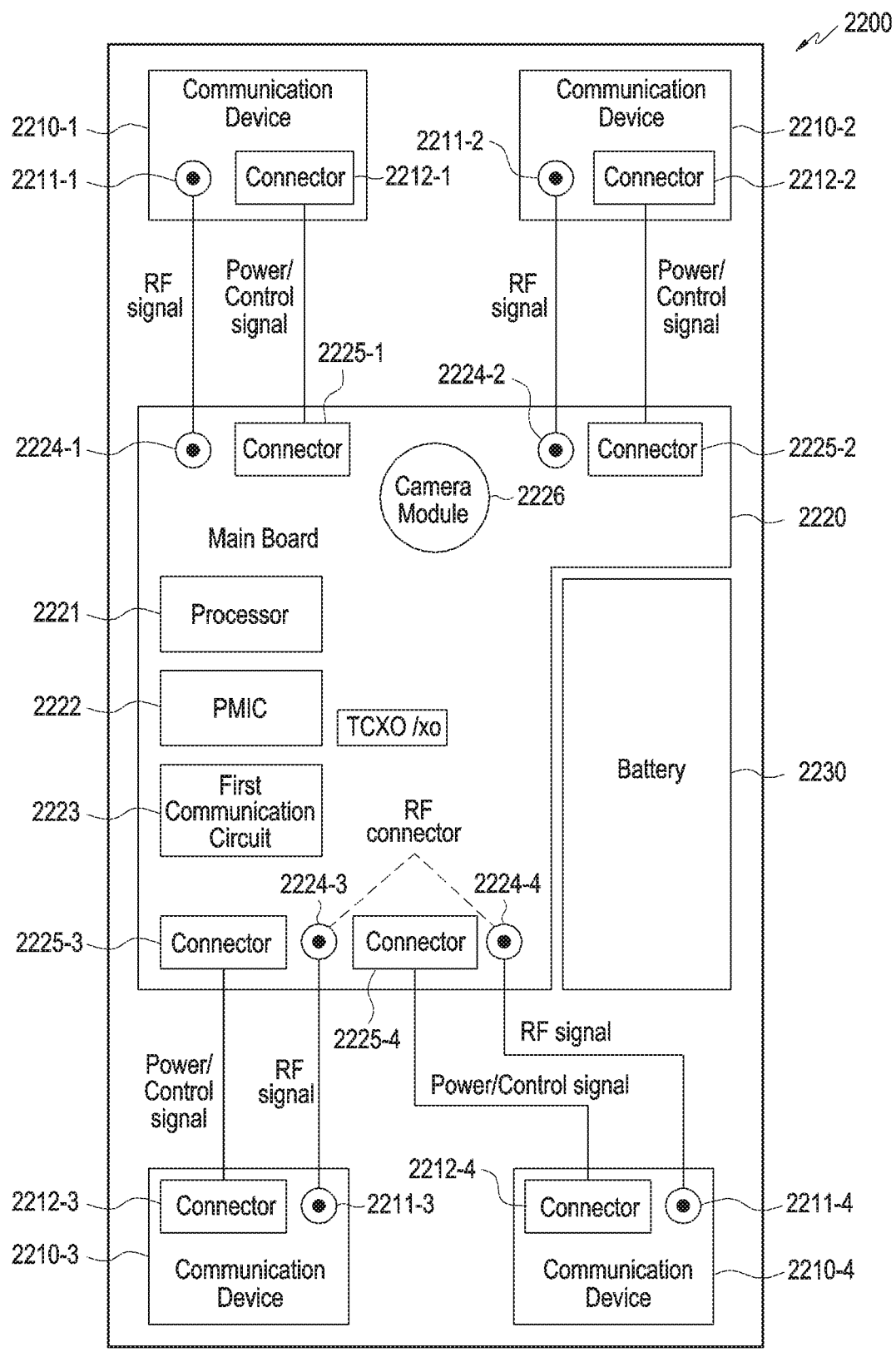
FIG. 22 illustrates an internal structure of an electronic device according to various embodiments of the present disclosure.

FIG. 22 illustrates an internal structure of an electronic device according to various embodiments of the present disclosure. Referring to FIG. 22, an electronic device 2200 according to various embodiments of the present disclosure may include a plurality of communication devices 2210 (e.g., the communication device 120 of FIG. 1, the communication device 731 of FIG. 7, or the communication device 2120 of FIG. 21), a main board 2220 (e.g., the PCB 110 of FIG. 1), and a battery 2230. Each of the plurality of communication devices 2210 may include an RF connector 2211 and a board connector 2212 as described above with reference to FIG. 21, and may communicate in connection with an RF connector 2224 and a board connector 2225 included in the main board 2220.

According to various embodiments, the communication device 2210 may include at least one array antenna, and may be formed, for example, in the form of a module including an array antenna.

The main board 2220 may include at least one of a processor 2221, a PMIC 2222, a first communication circuit 2223, the RF connector 2224, the board connector 2225, or a camera module 2226.

According to various embodiments, an analog transmission signal generated by the processor 2221 may be modulated into an RF signal or an IF signal by the first communication circuit 2223. The first communication circuit 2223 may transmit the modulated RF signal or IF signal to each communication device 2210 through each RF connector 2224.

According to various embodiments, the processor 2221 may generate a control signal and transmit the control signal to each communication device 2210 through the board connector 2225. According to various embodiments, the PMIC 2222 may supply power to each communication device 2210 through the board connector 2225.

Figure 23A:
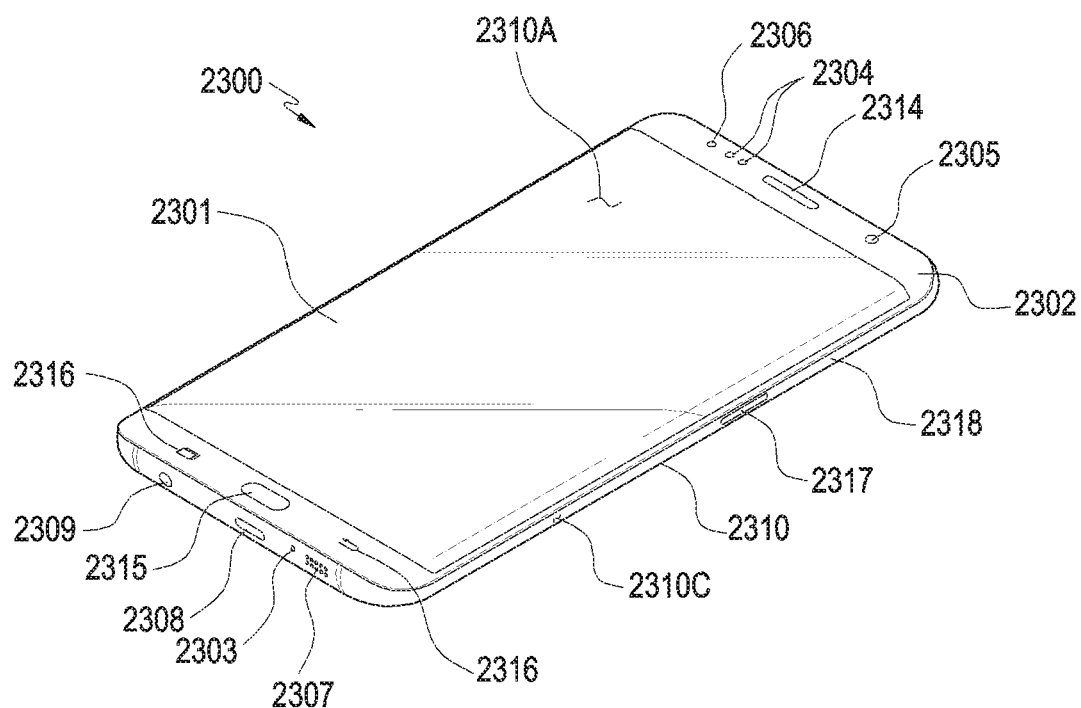
FIG. 23A is a front perspective view of an electronic device according to various embodiments of the present disclosure.
Figure 23B:
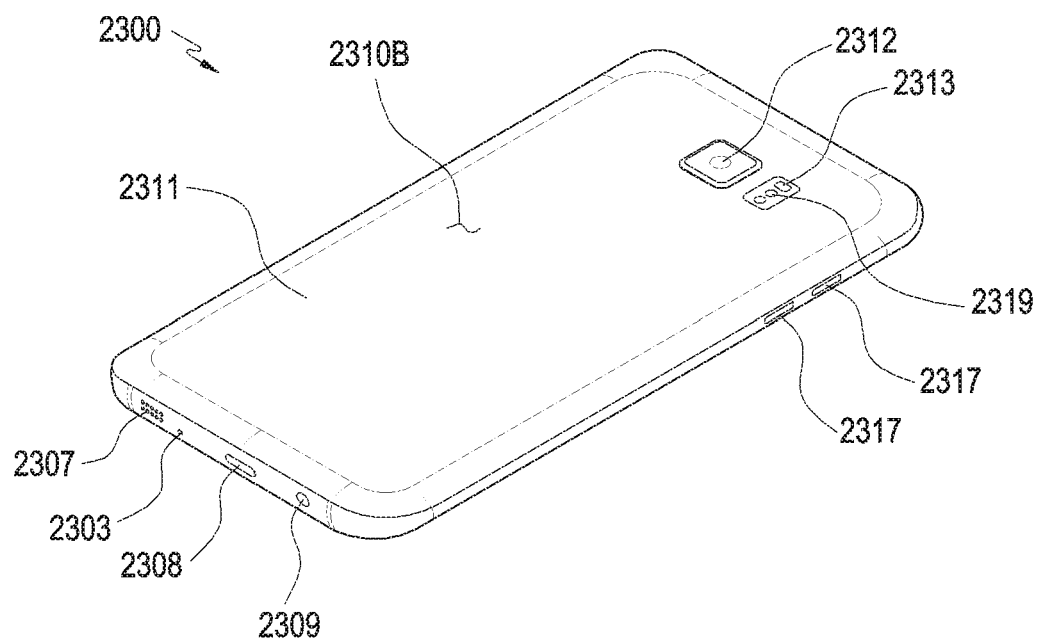
FIG. 23B is a rear perspective view of an electronic device according to various embodiments of the present disclosure.

FIG. 23A is a perspective view of a front surface of an electronic device, according to an embodiment, and FIG. 23B is a perspective view of a rear surface of the electronic device of FIG. 23A. Referring to FIGS. 23A and 23B, an electronic device 2300 (e.g., the electronic device 2200 of FIG. 22) according to an embodiment may include a housing 2310 that includes a first surface (e.g., a front surface) 2310A, a second surface (e.g., a rear surface) 2310B, and a side surface 2310C enclosing a space between the first surface 2310A and the second surface 2310B. In another embodiment (not shown), the housing may refer to a structure that forms some of the first surface 2310A, the second surface 2310B, and the side surface 2310C of FIG. 23A.

According to various embodiments, the first surface 2310A may be formed by a front plate 2302, at least a part of which is substantially transparent (for example, a glass plate including various coating layers or a polymer plate). The second surface 2310B is formed by a rear plate 2311 that is substantially opaque. The rear plate 2311 is formed by, for example, coated or painted glass, ceramic, polymer, metal (e.g., aluminum, stainless steel (STS), or magnesium) or a combination of at least two of the listed materials. The side surface 2310C is coupled with the front plate 2302 and the rear plate 2311, and is formed by a side bezel structure (or a "side member") 2318 including metal and/or polymer. In an embodiment, the rear plate 2311 and the side bezel structure 2318 may be formed as one piece and may include the same material (e.g., a metal material such as aluminum).

According to various embodiments, the electronic device 2300 may include at least one of a display 2301, audio modules 2303, 2307, and 2314, sensor modules 2304 and 2319, camera modules 2305, 2312, and 2313, key input devices 2315, 2316, and 2317, an indicator 2306, and connector holes 2308 and 2309. In some embodiments, the electronic device 2300 may exclude at least one (e.g., the key input devices 2315, 2316, and 2317 or the indicator 2306) of the components or add other components.

The display 2301 may be exposed through the most part of, for example, the front plate 2302. The display 2301 is coupled with or arranged in adjacent to a touch sensing circuit, a pressure sensor capable of measuring a strength (pressure) of a touch, and/or a digitizer for detecting a magnetic-type stylus pen.

The audio modules 2303, 2307, and 2314 may include the microphone holes 2303 and the speaker holes 2307 and 2314. Inside the microphone hole 2303 may be arranged a microphone for obtaining external sound, and may also be arranged a plurality of microphones for sensing a direction of the sound in an embodiment. The speaker holes 2307 and 2314 may include an external speaker hole 2307 and a call receiver hole 2314. In an embodiment, the speaker holes 2307 and 2314 and the microphone hole 2303 may be implemented as one hole or a speaker may be included without the speaker holes 2307 and 2314 (e.g., a piezo speaker).

The sensor modules 2304 and 2319 generate an electrical signal or data value corresponding to an internal operating state or external environmental state of the electronic device 2300. The sensor modules 2304 and 2319 may include a first sensor module 2304 (e.g., a proximity sensor) and/or a second sensor module (not shown, e.g., a fingerprint sensor) arranged on the first surface 2310A of the housing 2310 and/or a third sensor module 2319 (e.g., a heart rate monitor (HRM) sensor) arranged on the second surface 2310B of the housing 2310. The fingerprint sensor may be arranged on the second surface 2310B of the housing 2310 as well as the first surface 2310A of the housing 210 (e.g., a home key button 2315). The electronic device 2300 may further include at least one of a sensor module not shown, e.g., a gesture sensor, a gyro sensor, an atmospheric pressure sensor, a magnetic sensor, an acceleration sensor, a grip sensor, a color sensor, an infrared (IR) sensor, a bio sensor, a temperature sensor, a humidity sensor, or an illuminance sensor.

The camera modules 2305, 2312, and 2313 may include a first camera device 2305 arranged on the first surface 2310A of the electronic device 2300, a second camera device 2312 arranged on the second surface 2310B, and/or a flash 2313. The camera modules 2305 and 2312 may include one lens or a plurality of lenses, an image sensor, and/or an image signal processor. A flash 2313 may include, for example, a light-emitting diode or a xenon lamp. In an embodiment, two or more lenses (a wide lens and a telephoto lens) and image sensors may be arranged on a surface of the electronic device 2300.

The key input devices 2315, 2316, and 2317 may include the home key button 2315 arranged on the first surface 2310A of the housing 2310, a touch pad 2316 arranged around the home key button 2315, and/or a side key button 2317 arranged on the side surface 2310C of the housing 2310. In another embodiment, the electronic device 2300 may exclude some or all of the above-mentioned key input devices 2315, 2316, and 2317, and the excluded key input devices 2315, 2316, and 2317 may be implemented in other forms such as a soft key, etc., on the display 2301.

The indicator 2306 may be arranged, for example, on the first surface 2310A of the housing 2310. The indicator 2306 may provide state information of the electronic device 2300 in the form of light, and may include a light-emitting diode (LED).

The connector holes 2308 and 2309 may include a first connector hole 2308 capable of accommodating a connector (e.g., a universal serial bus (USB) connector) for transmitting and receiving power and/or data with an external electronic device and/or a second connector hole (e.g., an earphone jack) 2309 capable of accommodating a connector for transmitting and receiving an audio signal with the external electronic device.

Figure 24:
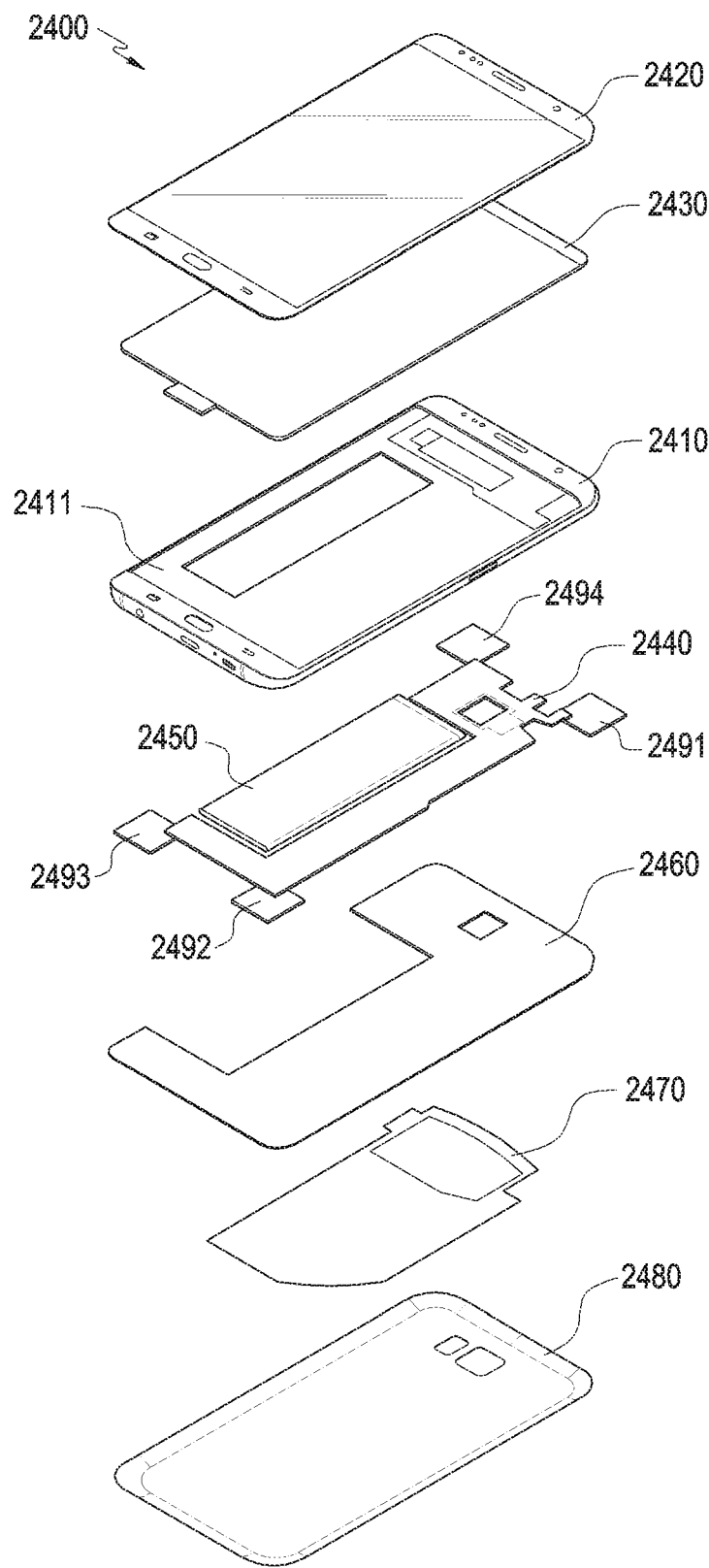
FIG. 24 is an exploded perspective view of an electronic device according to various embodiments of the present disclosure.

FIG. 24 is a planar perspective view of the electronic device shown in FIGS. 23A and 23B. Referring to FIG. 24, an electronic device 2400 (e.g., the electronic device 2200 of FIG. 22) according to various embodiments of the present disclosure may include a side bezel structure 2410, a first support member 2411 (e.g., a bracket), a front plate 2420, a display 2430, a printed circuit board (PCB) 2440, a battery 2450, a plurality of communication devices 2491, 2492, 2493, and 2494 (e.g., the communication device 120 of FIG. 1, the communication device 731 of FIG. 7, or the communication device 2120 of FIG. 21), a second support member 2469 (e.g., a rear case), an antenna 2470, and a rear plate 2480. In some embodiments, the electronic device 2400 may exclude at least one (e.g., the first support member 2411 or the second support member 2460) of the components or add other components.

The first support member 2411 is arranged inside the electronic device 2400 and is connected with the side bezel structure 2410 or is formed as one piece with the side bezel structure 2410. The first support member 2411 may be formed of, for example, a metal material and/or a non-metallic (e.g., polymer) material. The first support member 2411 is coupled with the display 2430 on a surface thereof and with the PCB 2440 on another surface thereof. On the PCB 2440 are mounted a processor, a memory, and/or an interface. The processor may include one or more of, for example, a central processing unit, an application processor, a graphic processor, an image signal processor, a sensor hub processor, or a communication processor.

The memory may include, for example, a volatile and/or nonvolatile memory.

An interface may include a high definition multimedia interface (HDMI), a universal serial bus (USB) interface, a secure digital (SD) card interface, and/or an audio interface. The interface may electrically or physically connect, for example, the electronic device 2400 with an external electronic device, and may include an USB connector, an SD card/MMC connector, or an audio connector.

The battery 2450 may be a device for supplying power to at least one component of the electronic device 2400. The battery 189 may include, e.g., a primary cell which is not rechargeable, a secondary cell which is rechargeable, or a fuel cell. At least a part of the battery 2400 may be arranged on substantially the same plane as, for example, the PCB 2440. The battery 2450 may be arranged as one piece inside the electronic device 2400 or may be arranged removably from the electronic device 2400.

The antenna 2470 is arranged between the rear plate 2480 and the battery 2450. The antenna 2470 may include, for example, a near field communication (NFC) antenna, a wireless charging antenna, and/or a magnetic secure transmission (MST) antenna. The antenna 2470 may perform short-range communication or wirelessly transmit and receive power needed for charging, with, for example, an external device. In another embodiment, an antenna structure may be formed by a part or a combination of the side bezel structure 2410 and/or the first support member 2411.

The side bezel structure 2410, the first support member 2411, and the second support member 2460 may form a housing (e.g., the housing 2310 of FIG. 23) as a whole. The housing may support the PCB 2440 and the plurality of antenna modules 2491 through 2494. The housing may have the shape of a substantially flat plate. In another embodiment, a part of the housing, e.g., at least a part of an edge thereof may have the shape of a curved surface.

The housing may be at least partially formed of a metal material to supplement and improve the rigidity of the electronic device, provide a proper installation position of electronic parts, and provide installation positions for some electronic parts where the electronic parts are installed isolated from each other.

The rear plate 2480 may be a part of the housing. For example, in various embodiments of the present disclosure, the housing and the rear plate 2480 are described as separate components, but the rear plate 2480 may form a uni-body with the housing or may be a part of the housing.

According to various embodiments of the present disclosure, the plurality of communication devices 2491 through 2494 may include four communication devices, for example, a first communication device 2491, a second communication device 2492, a third communication device 2493, and a fourth communication device 2493. For example, the first communication device 2491 and the second communication device 2492 may be implemented to transmit and receive RF signals (referred to as frequency signals A and B) having different characteristics for MIMO implementation. In another example, the first communication device 2491 and the third communication device 2493 may be configured to transmit and receive RF signals (referred to as frequency signals A1 and A2) having identical characteristics for diversity implementation, for example, at the same time. In another example, the second communication device 2492 and the fourth communication device 2494 may be configured to transmit and receive RF signals (referred to as frequency signals B1 and B2) having identical characteristics for diversity implementation, for example, at the same time. In an embodiment of the present disclosure, the plurality of antenna modules may include only two antenna modules, for example, the first communication device 2491 and the second communication device 2492, but in an example illustrated in FIG. 2 and other drawings, four communication devices 2491, 2492, 2493, and 2494 are included to implement MIMO and diversity at the same time.

Considering RF transmission and reception characteristics, when the first communication device 2491 may be arranged at a first position inside or on the housing, the second communication device 2492 may be arranged at a second position that is separated from the first position inside or on the housing. In another example, the first communication device 2491 and the third communication device 2493 may be arranged considering a distance therebetween corresponding to diversity or MIMO characteristics. In another example, the second communication device 2492 and the fourth communication device 2494 may also be arranged considering a distance therebetween inside or on the housing 210.

According to an embodiment, the housing may include a front plate and a rear plate that is directed opposite to the front plate with respect to a radiation direction of the plurality of communication devices 2491 through 2494. The housing may have a rectangular shape including a first side having a first length, a second side having a second length longer than the first length, a third side having the first length, and a fourth side having the second length.

According to an embodiment, when viewed from top of the front plate of the housing, the first communication device 2491 and the second communication device 2492 are arranged closer to the first side than the third side. In another example, the third communication device 2493 and the fourth communication device 2494 may be arranged closer to the third side than the first side when viewed from the top of the front plate of the housing. In another example, the first communication device 2492 and the third communication device 2493 may be arranged diagonally to each other when viewed from the top of the front plate of the housing in the rectangular shape. In another example, the second communication device 2492 and the fourth communication device 2494 may be arranged diagonally to each other when viewed from the top of the front plate of the housing.

According to an embodiment, the plurality of communication devices 2491 through 2494 may be connected with an array antenna and the second communication circuit that is connected with the array antenna to process transmission and reception signals of ultra high frequencies. The array antenna may be implemented as, for example, a patch-type radiation element array (e.g., a 4×4 radiation element array). A chip having a part of the second communication circuit implemented therein may have a structure in which the chip is coupled for example, through PCB wiring, in a side surface or a lower side (a rear side with respect to the radiation direction) of the patch-type radiation element array.

Figure 25:
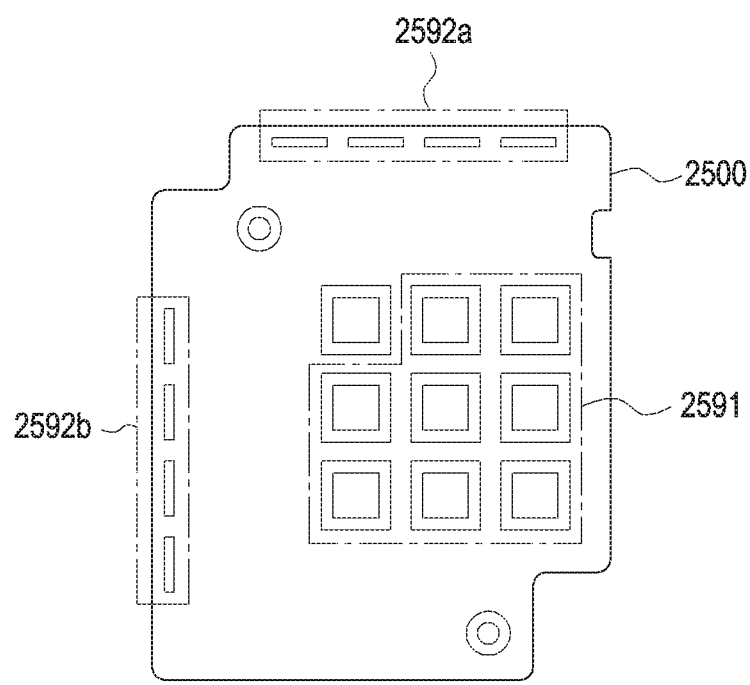
FIG. 25 illustrates a structure of a communication device according to various embodiments of the present disclosure.
Figure 26:
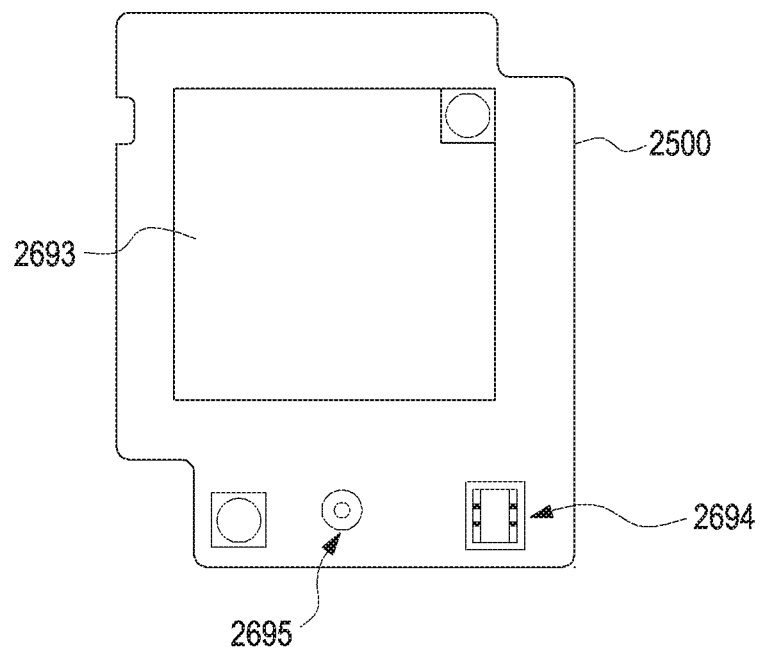
FIG. 26 illustrates a structure of a communication device according to various embodiments of the present disclosure.

FIGS. 25 and 26 are views illustrating a structure of a communication device according to various embodiments of the present disclosure, and show an example of a structure applicable to, for example, the plurality of communication devices 2491 to 2494 of FIG. 24. Referring to FIGS. 25 and 26, in a communication device (e.g., the communication device 120 of FIG. 1, the communication device 731 of FIG. 7, or the communication device 2120 of FIG. 21), at least one array antenna 2591, 2592*a*, and 2592*b* may be formed on a first surface of one PCB 2500, and a chip 2693 having implemented therein a part of the second communication circuit may be arranged on a second surface of the one PCB 2500.

According to an embodiment, the array antenna formed on the first surface of the PCB 2500 may include a total of 16 radiation elements including 8 patch-type radiation elements 2591 formed around the center of the first surface, 4 dipole-type radiation elements 2592*a* formed on a widthwise side surface of the PCB 2500, and 4 dipole-type radiation elements 2592*b* formed on a longitudinal side surface of the PCB 2500.

According to an embodiment, the chip 2693 implementing a part of the second communication circuit, a coaxial cable connector 2695 for connection with a main PCB (the PCB 110 of FIG. 1), and a board-to-board (B-to-B) connector 2694 may be formed on the second surface of the PCB 2500. The PCB 2500 of the communication device may be connected with the main PCB (e.g., the PCB 110 of FIG. 1) through the coaxial cable by using the coaxial cable connector 2695, and the coaxial cable may be used mainly for transmission and reception RF signal transfer. Power or other control signals may be transferred through the B-to-B connector 2694.

FIG. 27 is a block diagram illustrating an electronic device 2710 (e.g., the electronic device 2200 of FIG. 22 or the electronic device 2400 of FIG. 24) in a network environment 2700 according to various embodiments. Referring to FIG. 27, the electronic device 2701 in the network environment 2700 may communicate with an electronic device 2702 via a first network 2798 (e.g., a short-range wireless communication network), or an electronic device 2704 or a server 2708 via a second network 2799 (e.g., a long-range wireless communication network). According to an embodiment, the electronic device 2701 may communicate with the electronic device 2704 via the server 2708. According to an embodiment, the electronic device 2701 may include a processor 2720 (e.g., the processor 111 of FIG. 1), a memory 2730, an input device 2750, a sound output device 2755, a display device 2760, an audio module 2770, a sensor module 2776, an interface 2777, a haptic module 2779, a camera module 2780, a power management module 2788, a battery 2789, a communication module 2790 (e.g., the communication module 112 of FIG. 1), a subscriber identification module (SIM) 2796, and an antenna module 2797. In some embodiments, at least one (e.g., the display device 2760 or the camera module 2780) of the components may be omitted from the electronic device 2701, or other components may be added in the electronic device 101. In some embodiment, some components may be implemented to be integrated together, e.g., as if the sensor module 2776 (e.g., a fingerprint sensor, an iris sensor, or an illuminance sensor) is embedded in the display device 2760.

The processor 2720 may drive, e.g., software (e.g., a program 2740) to control at least one other component (e.g., a hardware or software component) of the electronic device 2701 connected with the processor 2720 and may process or compute various data. The processor 2720 may load and process a command or data received from another component (e.g., the sensor module 2776 or the communication module 2790) on a volatile memory 2732, and the processor 120 may store resultant data in a non-volatile memory 2734. According to an embodiment, the processor 2720 may include a main processor 2721 (e.g., a central processing unit (CPU) or an application processor (AP)) and an auxiliary processor 2723 that is operable independently from the main processor 2721, and additionally or alternatively, the auxiliary processor 2723 may include an auxiliary processor 2723 (e.g., a graphics processing unit (GPU), an image signal processor, a sensor hub processor, or a communication processor) that consumes less power than the main processor 2721 or is specified for a designated function. Here, the auxiliary processor 2723 may be operated separately from or embedded in the main processor 2721.

In such case, the auxiliary processor 2723 may control at least some of functions or states related to at least one (e.g., the display device 2760, the sensor module 2776, or the communication module 2790) of the components of the electronic device 2701, instead of the main processor 2721 while the main processor 2721 is in an inactive (e.g., sleep) state or along with the main processor 2721 while the main processor 2721 is an active state (e.g., performing an application). According to an embodiment, the auxiliary processor 2723 (e.g., an image signal processor or a communication processor) may be implemented as part of another component (e.g., the camera module 2780 or the communication module 2790) functionally related to the auxiliary processor 2723. The memory 2730 may store various data used by at least one component (e.g., the processor 2720 or the sensor module 2776) of the electronic device 2701, e.g., software (e.g., the program 2740) and input data or output data for a command related to the software. The memory 2730 may include the volatile memory 2732 or the non-volatile memory 2734.

The program 2740, as software stored in the memory 2730, may include, e.g., an operating system (OS) 2742, middleware 2744, or an application 2746.

The input device 2750 may be a device for receiving a command or data, which is to be used for a component (e.g., the processor 2720) of the electronic device 2701, from an outside (e.g., a user) of the electronic device 2701. The input device 50 may include, e.g., a microphone, a mouse, or a keyboard.

The sound output device 2755 may be a device for outputting sound signals to the outside of the electronic device 2701, and may include, e.g., a speaker which is used for general purposes, such as playing multimedia or recording and playing, and a receiver used for call receiving purposes only. According to an embodiment, the receiver may be formed integrally or separately from the speaker.

The display device 2760 may be a device for visually providing information to a user of the electronic device 2701. The display device 2760 may include, e.g., a display, a hologram device, or a projector and a control circuit for controlling the display, hologram device, or projector. According to an embodiment, the display 2760 may include a touch circuitry or a pressure sensor capable of measuring the strength of a pressure with respect to a touch.

The audio module 2770 may convert a sound into an electrical signal and vice versa. According to an embodiment, the audio module 2770 may obtain the sound via the input device 2750, or output the sound via the sound output device 2755 or a headphone of an external electronic device (e.g., an electronic device 2702) wiredly or wirelessly coupled with the electronic device 2701.

The sensor module 2776 may generate an electrical signal or data value corresponding to an internal operating state (e.g., power or temperature) or external environmental state of the electronic device 2701. The sensor module 2776 may include, e.g., a gesture sensor, a gyro sensor, an atmospheric pressure sensor, a magnetic sensor, an acceleration sensor, a grip sensor, a proximity sensor, a color sensor, an infrared (IR) sensor, a bio sensor, a temperature sensor, a humidity sensor, or an illuminance sensor.

The interface 2777 may support a designated protocol enabling a wired or wireless connection with an external electronic device (e.g., the electronic device 2702). According to an embodiment, the interface 2777 may include a high definition multimedia interface (HDMI), a universal serial bus (USB) interface, a secure digital (SD) card interface, or an audio interface.

A connecting terminal 2778 may include a connector, e.g., an HDMI connector, a USB connector, an SD card connector, or an audio connector (e.g., a headphone connector), which is able to physically connect the electronic device 2701 with an external electronic device (e.g., the electronic device 2702).

The haptic module 2779 may convert an electrical signal into a mechanical stimulus (e.g., a vibration or motion) or electrical stimulus which may be recognized by a user via his tactile sensation or kinesthetic sensation. The haptic module 2779 may include, e.g., a motor, a piezoelectric element, or an electric stimulator.

The camera module 2780 may capture a still image or moving images. According to an embodiment, the camera module 2780 may include one or more lenses, an image sensor, an image signal processor, or a flash.

The power management module 2788 may be a module for managing power supplied to the electronic device 2701. The power management module 188 may be configured as at least part of, e.g., a power management integrated circuit (PMIC).

The battery 2789 may be a device for supplying power to at least one component of the electronic device 2701. The battery 2789 may include, e.g., a primary cell which is not rechargeable, a secondary cell which is rechargeable, or a fuel cell.

The communication module 2790 may support establishing a wired or wireless communication channel between the electronic device 2701 and an external electronic device (e.g., the electronic device 2702, the electronic device 2704, or the server 2708) and performing communication through the established communication channel. The communication module 2790 may include one or more communication processors that are operated independently from the processor 2720 (e.g., an application processor) and supports wired or wireless communication. According to an embodiment, the communication module 2790 may include a wireless communication module 2792 (e.g., a cellular communication module, a short-range wireless communication module, or a GNSS communication module) or a wired communication module 2794 (e.g., an LAN communication module or a power-line communication module), and may communicate with the external electronic device via the first network 2798 (e.g., a short-range communication network, such as Bluetooth™, wireless-fidelity (Wi-Fi) direct, or infrared data association (IrDA)) or the second network 2799 (e.g., a long-range communication network, such as a cellular network, the Internet, or a computer network (e.g., an LAN or wide area network (WAN)). The above-enumerated types of communication modules 2790 may be implemented in a single chip, where at least some of the modules are integrated, or individually in separate chips.

According to an embodiment, the wireless communication module 2792 may differentiate and authenticate the electronic device 2701 in the communication network using user information stored in the subscriber identification module 2796.

The antenna module 2797 may include one or more antennas for transmitting or receiving a signal or power to/from an outside. According to an embodiment, the communication module 2790 (e.g., the wireless communication module 2792) may transmit or receive a signal to/from an external electronic device through an antenna appropriate for a communication scheme.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 2701 and the external electronic device 2704 via the server 2708 coupled with the second network 2799. Each of the electronic device 2702 and the electronic device 2704 may be a device of the same type as, or a different type, from the electronic device 2701. According to an embodiment, some or all of operations performed by the electronic device 2701 may be performed in another electronic device or a plurality of other electronic devices. According to an embodiment, when the electronic device 2701 has to perform a function or a service automatically or at a request, the electronic device 2701 may request an external electronic device to perform at least some functions associated with the function or the service, instead of or in addition to executing the function or the service. The external electronic device having received the request may execute the requested function or additional function and transfer the execution result to the electronic device 2701. The electronic device 2701 may then process or further process the received result to provide the requested function or service. To that end, a cloud computing, distributed computing, or client-server computing technology may be used, for example.

Each of the foregoing elements described in various embodiments of the present disclosure may be configured with one or more components, names of which may vary with a type of the electronic device. In various embodiments, the electronic device may include at least one of the foregoing elements, some of which may be omitted or to which other elements may be added. In addition, some of the elements of the electronic device according to various embodiments may be integrated into one entity to perform functions of the corresponding elements in the same manner as before they are integrated.

A term "module" used herein may mean, for example, a unit including one of or a combination of two or more of hardware, software, and firmware. The "module" may be interchangeably used with a unit, a logic, a logical block, a component, or a circuit. The "module" may be a minimum unit or a portion of an integrated component. The "module" may be a minimum unit or part thereof, adapted to perform one or more functions. The "module" may be implemented mechanically or electronically. For example, the "module" according to the embodiments may include at least one of an application-specific integrated circuit (ASIC) chip, field-programmable gate arrays (FPGAs), and a programmable-logic device performing certain operations already known or to be developed.

At least a part of an apparatus (e.g., modules or functions thereof) or a method (e.g., operations) according to various embodiments may be implemented with a command stored in a computer-readable storage medium in the form of a programming module. When the instructions are executed by one or more processors, the one or more processors may perform functions corresponding to the instructions. The computer-readable storage medium may be, for example, a memory.

The computer readable recording medium includes hard disk, floppy disk, or magnetic media (e.g., a magnetic tape, optical media (e.g., compact disc read only memory (CD-ROM) or digital versatile disc (DVD), magneto-optical media (e.g., floptical disk), a hardware device (e.g., read-only memory (ROM), random access memory (RAM), flash memory, etc.), and so forth. Further, the program instructions may include a machine language code created by a complier and a high-level language code executable by a computer using an interpreter. The foregoing hardware device may be configured to be operated as at least one software module to perform an operation of the present disclosure, or vice versa.

Modules or programming modules according to various embodiments of the present disclosure may include one or more of the foregoing elements, have some of the foregoing elements omitted, or further include additional other elements. Operations performed by the modules, the programming modules or other elements according to various embodiments may be executed in a sequential, parallel, repetitive or heuristic manner. Also, some of the operations may be executed in different order or omitted, or may have additional different operations.

The embodiments disclosed herein have been provided for description and understanding of disclosed technical matters, and are not intended to limit the scope of the present disclosure. Therefore, it should be construed that the scope of the present disclosure includes any change or other various embodiments based on the technical spirit of the present disclosure.

The invention claimed is:

1. An electronic device comprising:
a housing;
a plurality of antennas arranged on or inside the housing;
a plurality of second communication circuits positioned inside the housing and electrically connected with the plurality of antennas, respectively;
a first communication circuit electrically connected with the plurality of second communication circuits and configured to generate a signal in a radio frequency (RF) band (RF signal) or a signal in an intermediate frequency (IF) band (IF signal) and transmit the RF signal or the IF signal to at least one of the plurality of second communication circuits;
a first memory included in each of the plurality of second communication circuits storing at least one parameter generated during calibration of each of the plurality of second communication circuits; and
a control circuit electrically connected with the first communication circuit,
wherein the control circuit is configured to:
receive the at least one parameter stored in the first memory;
store the received at least one parameter in a second memory; and
transmit a control signal for controlling at least one amplifier included in the plurality of second communication circuits to the plurality of second communication circuits, based on the at least one parameter stored in the second memory.

2. The electronic device of claim 1, wherein the control signal comprises a signal for controlling a gain and/or a bias of the at least one amplifier included in the plurality of second communication circuits.

3. The electronic device of claim 1, further comprising a plurality of communication devices arranged inside the housing, wherein the plurality of communication devices comprises the plurality of antennas and the plurality of second communication circuits, respectively.

4. The electronic device of claim 1, wherein each of the plurality of second communication circuits comprises at least one of a phase shifter drive amplifier (PSDA), a phase shifter (PS), a pre-power amplifier (PPA), or a power amplifier (PA).

5. The electronic device of claim 4, wherein the control signal comprises a signal for controlling a gain and/or a bias of at least one of the PSDA, the PPA, or the PA.

6. The electronic device of claim 5, wherein the control signal comprises a signal for controlling a gain and/or a bias of at least one amplifier included in the PSDA, a gain and/or a bias of at least one amplifier included in the PPA, or a gain and/or a bias of at least one amplifier included in the PA.

7. The electronic device of claim 1, further comprising a printed circuit board (PCB) arranged inside the housing,
wherein the first communication circuit and the control circuit are included in the PCB.

8. The electronic device of claim 7,
wherein the second memory is arranged on the PCB, and
wherein the control circuit is configured to receive the at least one parameter stored in the first memory and store the received at least one parameter in the second memory.

9. The electronic device of claim 1, wherein the IF signal corresponds to a frequency between 8 GHz and 12 GHz and the RF signal corresponds to a frequency between 25 GHz to 60 GHz.

10. An operation method of an electronic device including a first memory included in a plurality of second communication circuits, the operation method comprising:
generating, by a first communication circuit, a signal in a radio frequency (RF) band (RF signal) or a signal in an intermediate frequency (IF) band (IF signal);
transmitting the RF signal or the IF signal, generated by the first communication circuit, to at least one of the plurality of second communication circuits;
transmitting at least one parameter stored in the first memory, generated during calibration of each of the plurality of second communication circuits, to a second memory;
transmitting a control signal, generated based on the at least one parameter of the plurality of second communication circuits, to the plurality of second communication circuits;
receiving, by the plurality of second communication circuits, the control signal and controlling at least one amplifier included in the plurality of second communication circuits based on the received control signal; and
transmitting, by the plurality of second communication circuits, a signal amplified by the at least one amplifier to a plurality of antennas.

11. The operation method of claim 10,
wherein the electronic device further comprises a plurality of communication devices arranged inside a housing, and
wherein the plurality of communication devices comprises the plurality of antennas and the plurality of second communication circuits, respectively.

12. The operation method of claim 11, wherein the at least one parameter is uniquely set to correspond to the plurality of second communication circuits.

13. The operation method of claim 10,
wherein the electronic device further comprises a printed circuit board (PCB) arranged inside a housing, and
wherein the first communication circuit is included in the PCB.

14. The operation method of claim 13,
wherein the electronic device further comprises:
the second memory arranged on the PCB, and
wherein the operation method further comprises transmitting the at least one parameter stored in the first memory to the second memory.

* * * * *